US006556158B2

(12) United States Patent
Steensgaard-Madsen

(10) Patent No.: US 6,556,158 B2
(45) Date of Patent: Apr. 29, 2003

(54) RESIDUE-COMPENSATING A/D CONVERTER

(75) Inventor: Jesper Steensgaard-Madsen, New York, NY (US)

(73) Assignee: Esion, LLC, Carlsbad, CA (US)

( * ) Notice: Subject to any disclaimer, the term of this patent is extended or adjusted under 35 U.S.C. 154(b) by 0 days.

(21) Appl. No.: 09/694,063

(22) Filed: Mar. 5, 2001

(65) Prior Publication Data

US 2002/0041247 A1 Apr. 11, 2002

Related U.S. Application Data

(60) Provisional application No. 60/116,456, filed on Jan. 19, 1999.

(30) Foreign Application Priority Data

Oct. 29, 1999 (WO) .............................. PCT/IB99/01745

(51) Int. Cl.[7] .............................. H03M 1/12; H03M 1/20
(52) U.S. Cl. ....................................... 341/131; 341/156
(58) Field of Search ................................ 341/118, 120, 341/131, 143, 155, 156; 348/574

(56) References Cited

U.S. PATENT DOCUMENTS

| | | | | |
|---|---|---|---|---|
| 5,940,138 A | * | 8/1999 | Lowe | 348/574 |
| 6,268,814 B1 | * | 7/2001 | Koisrud | 341/131 |
| 6,351,229 B1 | * | 2/2002 | Wang | 341/143 |

OTHER PUBLICATIONS

Search report established Mar. 14, 2000, for PCT/IB99/01403, on which this application is based.
Jewett R. et al: A 12b 128 MSample/S ADC with 0.05LSB DNL, IEEE International Solid–State Circuits Conference, US, IEEE Inc. New York; vol. 40, Feb. 1, 1997, pp. 138–139, ISSN 0193–6530.

Todd Brooks et al, "A Cascaded Sigma–Delta Pipeline A/D Converter with 1.25 MHz Bandwidth and 89 dB SNR," IEEE Journal of Solid–State Circuits, vol. 32, No. 12, Dec. 1997.

* cited by examiner

*Primary Examiner*—Patrick Wamsley

(57) ABSTRACT

An analog-to-digital converter system [50D] processing an input signal, g, which can be either a discrete-time or a continuous-time signal. A first quantizer [154] generates a first digital signal, d0(k), representing the sum of the input signal, g, and a dithering signal, y0. A digital-to-analog converter [156] generates an analog feedback signal, alpha, representing accurately the first digital signal, d0(k). The DAC [156] may be linearized by the use of mismatch-shaping techniques. A filter [158] generates the dithering signal, y0, by selectively amplifying in the signal band the residue signal, r0, defined as the difference of the input signal, g, and the analog feedback signal, alpha. Optional signal paths [166][168] are used to minimize the closed-loop signal transfer function from g to y0, which ideally will be zero. An analog compensation signal, m0, which is described by a well-controlled relationship to the residue signal, r0, is extracted from the filter [158]. Ideally, the closed-loop signal transfer function from g to m0 will be zero, or at least small in the signal band. A second quantizer [160] converts the analog compensation signal, m0, into a second digital signal, dm0(k). The two digital signals, d0(k) and dm0(k), are filtered individually and then added to form the overall output signal, $d_g(k)$. The second digital filter [164] has a low signal-band gain, which implies that the sensitivity to signal-band errors caused by the second quantizer [160] will be low. The output signal, $d_g(k)$, is a highly-accurate high-resolution representation of the input signal, g. Circuit imperfections, such as mismatch, gain errors, and nonlinearities, will cause only noise-like errors having a very low spectral power density in the signal band.

Figure 1:
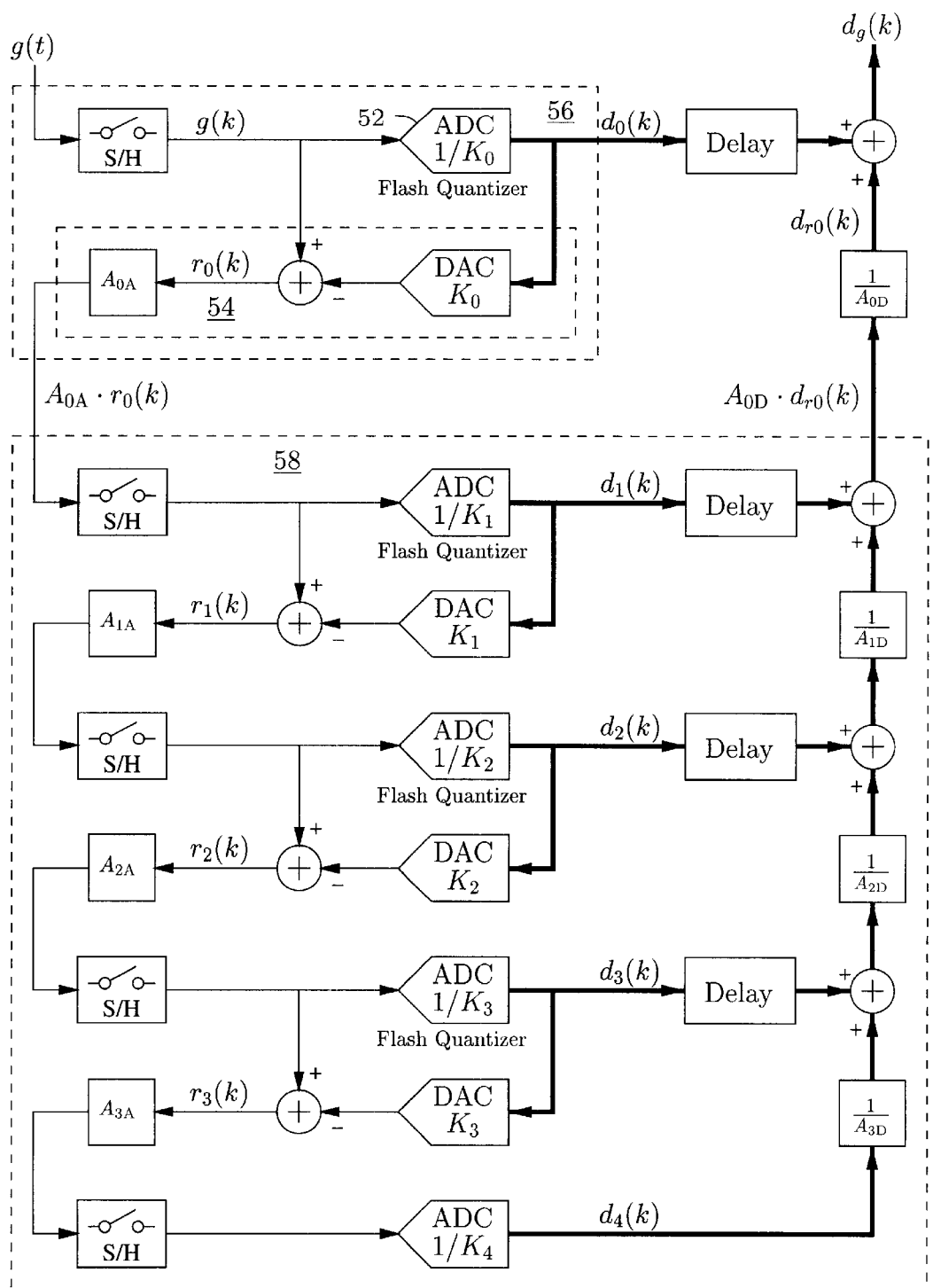

The invention facilitates the implementation of uncalibrated highly-linear high-resolution wide-bandwidth A/D converters [50D], e.g., for use in digital communication systems, such as xDSL modems and other demanding consumer-market products for which low cost is of the essence.

48 Claims, 21 Drawing Sheets

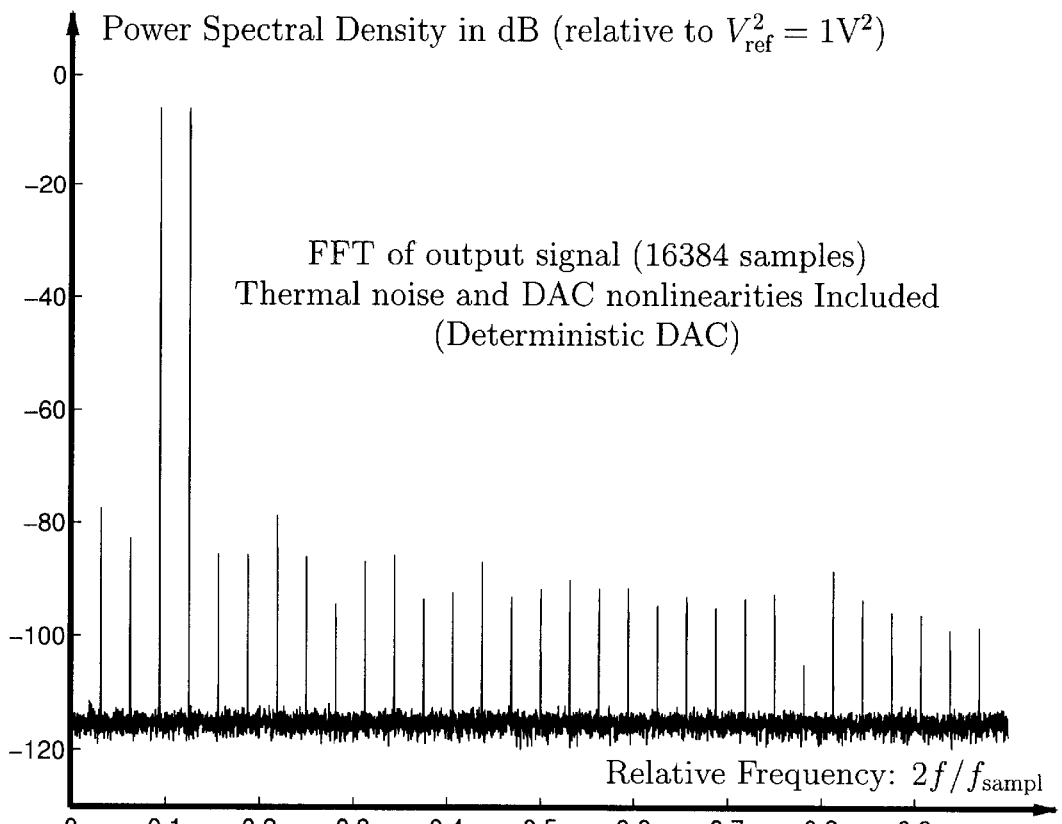
FIGURE 7 (PRIOR ART)
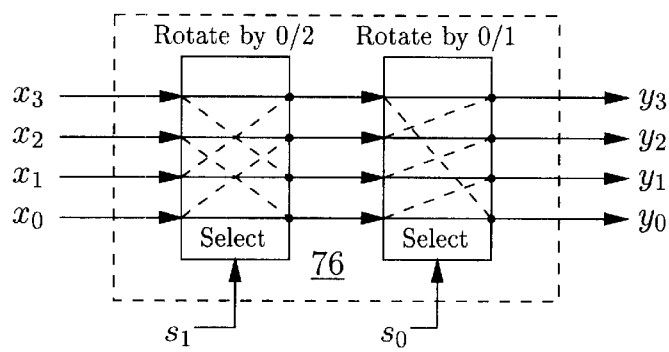
FIGURE 9
| Select Signals | $y_0$ | $y_1$ | $y_2$ | $y_3$ |
|---|---|---|---|---|
| $s_1 s_0 = 00$ | $x_0$ | $x_1$ | $x_2$ | $x_3$ |
| $s_1 s_0 = 01$ | $x_3$ | $x_0$ | $x_1$ | $x_2$ |
| $s_1 s_0 = 10$ | $x_2$ | $x_3$ | $x_0$ | $x_1$ |
| $s_1 s_0 = 11$ | $x_1$ | $x_2$ | $x_3$ | $x_0$ |
FIGURE 10

$$S_0(k) = A_0 \cdot \left[ g(k-1) + \sum_{i=0}^{k-2} r_0(i) \right]$$

$$S_1(k) = w_1 \cdot \left[ \sum_{j=0}^{k-2} \sum_{i=0}^{j-1} r_0(i) \right]$$

$$S_2(k) = w_2 \cdot \left[ \sum_{l=0}^{k-2} \sum_{j=0}^{l} \sum_{i=0}^{j} r_0(i) \right] + w_1 \cdot \left[ \sum_{j=0}^{k-2} \sum_{i=0}^{j-1} r_0(i) \right] + A_0 \cdot \left[ \sum_{i=0}^{k-1} r_0(i) \right]$$

$$S_3(k) = K_0 \cdot d_0(k) + S_0(k) = -m_0(k) = -\sum_{i=0}^{k-1} r_0(i)$$

$$S_4(k) = -K_1 \cdot u_1(k-2) + \sum_{i=0}^{k-2} r_0(i)$$

where, $r_0(k) = g(k) - K_0 \cdot d_0(k)$, and assuming that: $S_i(k) = 0$ for $k < 0$

FIGURE 34B

| | | |
|---|---|---|
| $S_0(1) = A_0 \cdot g(0)$ | $S_0(2) = A_0 \cdot [g(1) + r_0(0)]$ | $S_0(3) = A_0 \cdot [g(2) + r_0(1) + r_0(0)]$ |
| $S_1(1) = 0$ | $S_1(2) = w_1 \cdot [r_0(0)]$ | $S_1(3) = w_1 \cdot [r_0(1) + 2r_0(0)]$ |
| $S_2(1) = A_0 \cdot r_0(0)$ | $S_2(2) = A_0 \cdot [r_0(1) + r_0(0)]$ $+ w_1 \cdot [r_0(0)]$ $+ w_2 \cdot [r_0(0)]$ | $S_2(3) = A_0 \cdot [r_0(2) + r_0(1) + r_0(0)]$ $+ w_1 \cdot [r_0(1) + 2r_0(0)]$ $+ w_2 \cdot [r_0(1) + 3r_0(0)]$ |
| $S_3(1) = -r_0(0)$ | $S_3(2) = -[r_0(1) + r_0(0)]$ | $S_3(3) = -[r_0(2) + r_0(1) + r_0(0)]$ |
| $S_4(1) = 0$ | $S_4(2) = [r_0(0) - K_1 \cdot u_1(0)]$ | $S_4(3) = [r_0(1) + r_0(0) - K_1 \cdot u_1(1)]$ |

FIGURE 34C

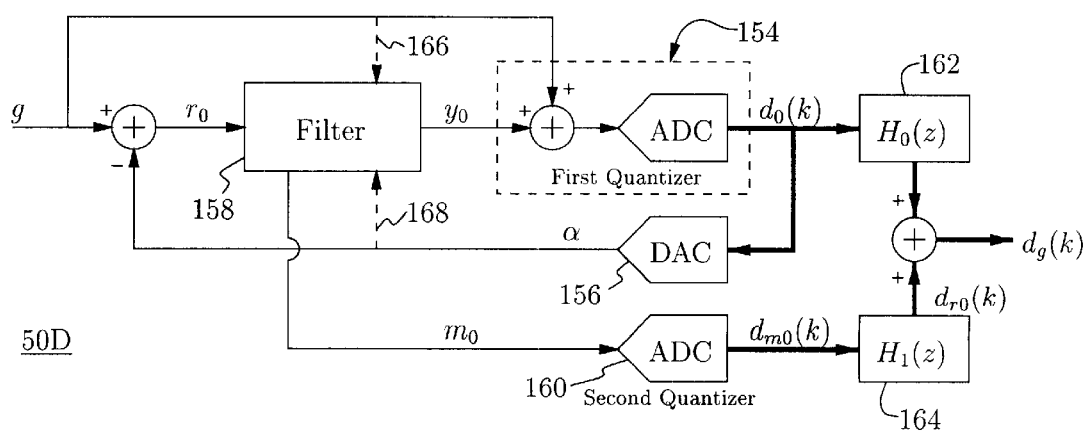

FIGURE 35

US 6,556,158 B2

RESIDUE-COMPENSATING A/D CONVERTER

1.1 RELATED APPLICATION DATA

This invention is based on and claims priority from U.S. Provisional Patent Application No. 60/116,456, filed Jan. 19, 1999, and international application PCT/IB99/01745, filed Oct. 29, 1999.

1. FIELD OF INVENTION

The field of invention is data conversion, more particularly, this invention relates to multi-step analog-to-digital converters.

1.2 Inventor

Jesper Steensgaard-Madsen, 448 Riverside Drive, apartment # 2, New York, N.Y. 10027, USA, is the sole inventor and applicant. The applicant is a citizen of Denmark.

2. DESCRIPTION OF PRIOR ART

Highly-linear high-speed analog-to-digital converters (ADCs) are key elements in many electrical systems of great importance. Digital communication systems, e.g., digital-subscriber-line (xDSL) modems, which are capable of providing wide-bandwidth communication via traditional phone lines, are an example of where a system's overall performance may be limited by the ADC front-end's finite linearity. The available high-performance ADCs needed for xDSL modems are relatively expensive and will often represent a large fraction of the system's overall cost. Furthermore, considering that the required good linearity usually is achieved by brute-force calibration of the ADC circuit, the long-term performance reliability may be poor due to aging, ambient temperature variations, and other effects which may cause the circuit's electrical properties to drift.

2.1 Multi-Step A/D Converters

Multi-step conversion techniques are generally preferred for the implementation of wide-bandwidth high-resolution ADCs. Pipelined multi-step ADCs, hereinafter simply called pipeline ADCs, are generally implemented using switched-capacitor (SC) circuit techniques and may be used for applications with a sampling rate of up to 100 MHz (sometimes even more). Pipeline ADCs' market share is significant due to the relatively good linearity and bandwidth achievable at a low cost and circuit complexity. FIG. 1 shows a typical 5-step pipeline ADC [50]. The input signal g(t) is sampled at equidistant instances in time (the symbol g(k) represents g(t) for t=k·$T_{clk}$, where k is integer and $T_{clk}$ is the sampling period) and converted into a first coarse (having, say, 3 bits of resolution) digital representation $d_0(k)$ by a first flash quantizer [52]. The residue $r_0(k)$ of g(k) with respect to $d_0(k) \cdot K_0$, where $K_0$ is the reciprocal of the ADC's [50] gain, is calculated by the first residue stage [54]. In the ideal case, the following relationship will result: $g(k)=d_0(k) \cdot K_0+r_0(k)$. The objective is to generate an estimate $d_{r0}(k)$ of $r_0(k)/K_0$, whereby an estimate $d_0(k)$ of $g(k)/K_0$ can be easily calculated: $d_g(k)=d_0(k)+d_{r0}(k)$. In other words, $d_{r0}(k)$ compensates for the residue $r_0(k)$ of the first-stage quantization $d_0(k)$, i.e., the system [50] is a multi-step residue-compensating ADC.

Gain Scaling.

An amplified version $A_{0A} \cdot r_0(k)$, rather than $r_0(k)$ itself, is quantized to $A_{0D} \cdot d_{r0}(k)$, where nominally $A_{0A}=A_{0D}=A_0$. The analog-domain amplification, $A_{0A}$, can easily be made an integral part of the residue stage [54] (discussed below). The advantage of amplifying the analog signal level by $A_0$ is that noise, offset, and all other errors from the residue quantizer [58], will be suppressed by $1/A_0$ when referred to the output signal $d_g(k)$. It is thus preferable to make $A_0$ large. How large $A_0$ can be made depends on the magnitude of $r_0(k)$ relative to the residue quantizer's [58] full-scale range, i.e., $A_0$ will largely be proportional to the resolution of $d_0(k)$.

Digital Correction.

Figure 2:
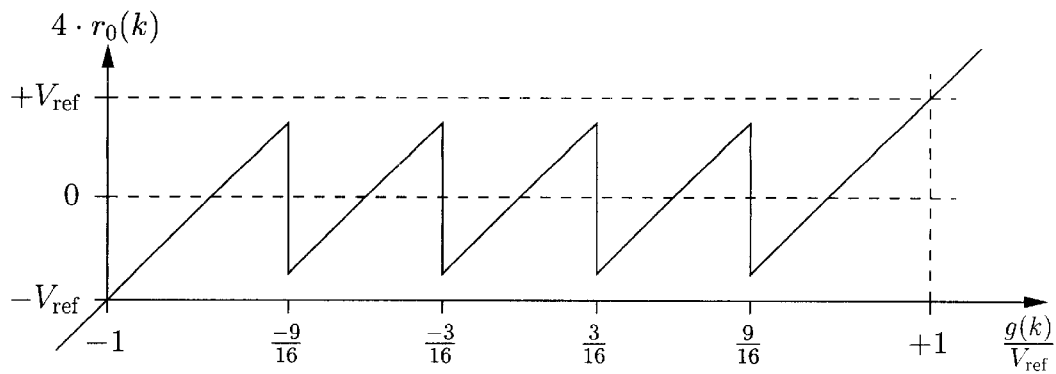

FIG. 2 shows an example of a typical nominal characteristic of 4·$r_0(k)$ as a function of g(k) when using a 5-level flash quantizer [52]. It is assumed that the overall pipeline ADC [50D], as well as the residue quantizer [58], is able to resolve their respective input signals in a range from $-V_{ref}$ to $+V_{ref}$. Notice that the chosen gain factor $A_0=4$, in principle, can be increased from 4 to 5. However, choosing $A_0$ as the nominally largest possible value is not recommendable because the flash quantizer [52] will generally be subject to substantial imperfections/nonlinearities, in which case the amplified residue signal 4·$r_0(k)$ rather will be described by the qualitative characteristic shown in FIG. 3. It is a key point that the overall operation will be robust with respect to all errors from the flash quantizer [52], provided that $A_0 \cdot r_0(k)$ is calculated correctly and the residue quantizer [58] is not overloaded. The concept of deliberately under designing the residue stage's [54] gain factor, $A_0$, is usually called for "digital correction." Because it is a very simple and low-cost way to avoid potentially large nonlinearities due to displacement of the flash quantizer's [52] threshold voltages, digital correction is used extensively in essentially all modern pipeline ADCs.

Pipelining.

Consider again FIG. 1. From a simplistic point of view (i.e., when neglecting the impact of digital correction), $d_0(k)$ is the most significant digit and $d_{r0}(k)$ the least significant digits of $d_g(k)$ represented in a number system which is not necessarily the Arabian base-10 system. Thus, a pipeline ADC [50] may be construed as a system that digitizes the input signal g(k) sequentially one digit at a time (here, for simplicity, assuming that all signals have the same resolution, which need not be the case): $d_0(k)$, $d_1(k)$, $d_2(k)$, $d_3(k)$, and then $d_4(k)$. To allow a high sampling rate, the determination of the individual digits is spread over several clock cycles and separate circuit stages. In other words, the first stage [56] determines the most-significant digit of the most recent sample of g(k), while the residue quantizer [58] determines the less-significant digits in the four previous samples (one digit per input sample per clock cycle). It is, therefore, necessary to delay individually the digit signals, $d_0(k)$, $d_1(k)$, $d_2(k)$, $d_3(k)$, and $d_4(k)$, such that the digits representing the same input sample are combined to form one sample of $d_g(k)$. The technique of staggering in time and spreading over several circuit stages the determination of the individual digits is called "pipelining."

Implementation.

Figure 4:
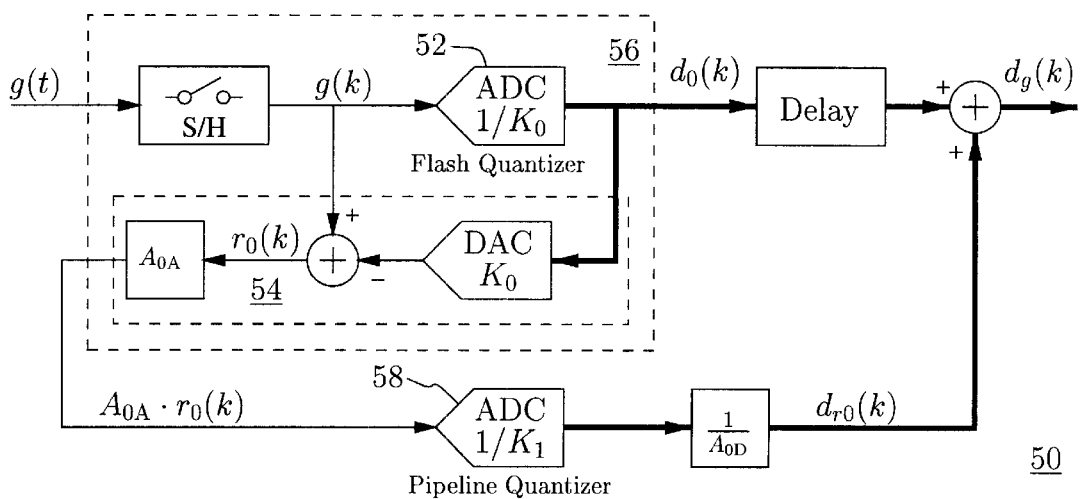

FIG. 4 shows a simplified representation of the pipeline ADC [50] from FIG. 1; the simplification lies only in the more compact representation of the residue quantizer [58]. This simplified representation is particularly useful if the gain factor $A_0$ is relatively high, in which case the subsequent quantizer [58] often can be modeled by an ideal one when evaluating the overall performance. In fact, the residue quantizer [58] is often designed using second-grade circuitry with low power consumption, such that its linearity is only as good as necessary. Assuming that this assumption is justifiable, and that digital correction is used wisely, it may be concluded that the errors that will limit the ADC's [50] performance will originate from imperfections in the first residue stage [54].

Figure 5:
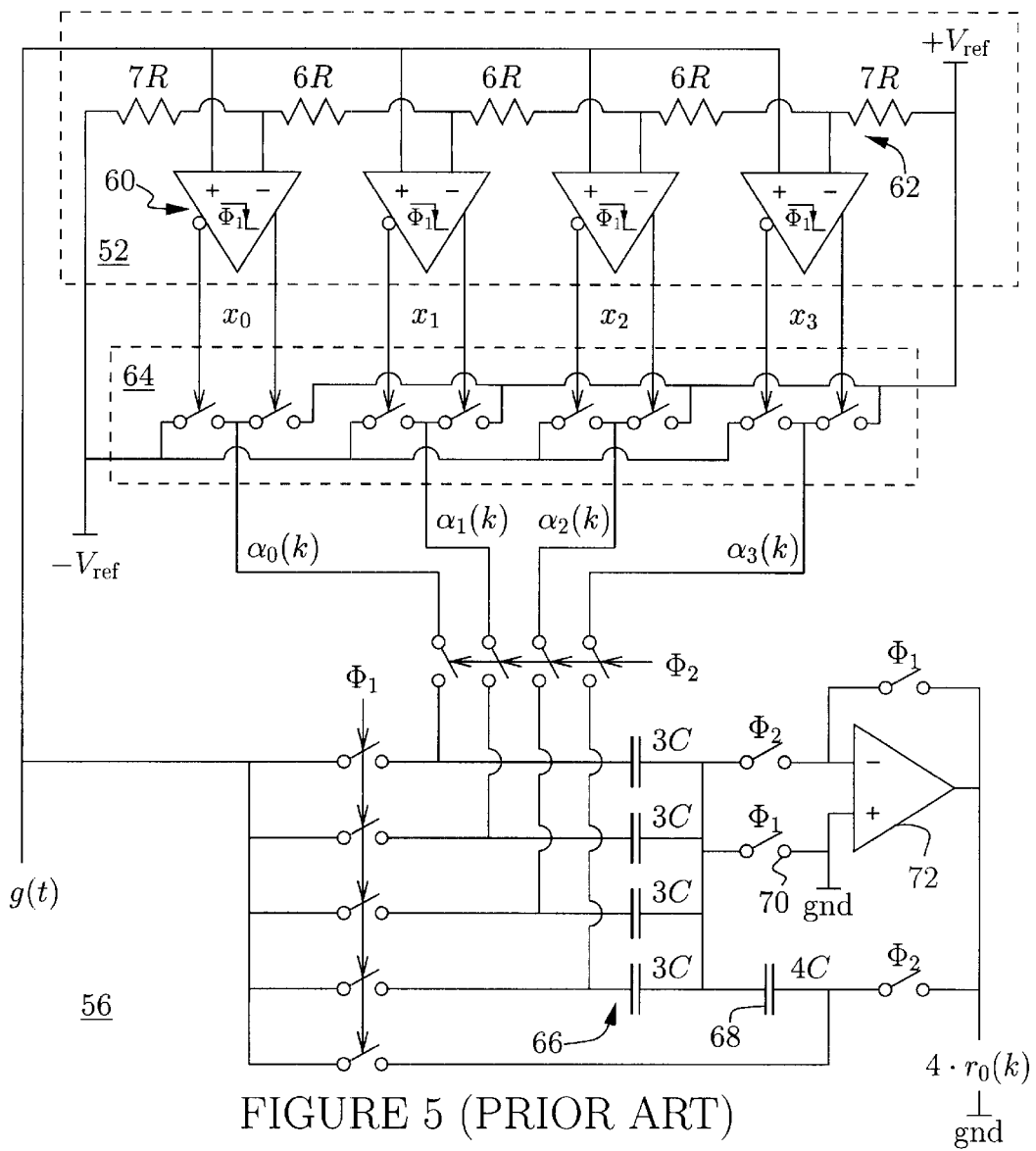

FIG. 5 shows how the input stage [56] can be implemented efficiently. The flash quantizer [52] is based on an array of latches [60] (for simplicity, only four latches [60] are shown, although the use of 8, 16, or even 32 latches generally is preferable) and a resistor ladder [62] generating the latches' [60] nominal threshold voltages. Four boolean signals, $x_0$, $x_1$, $x_2$, and $x_3$, generated when strobing the latches [60] represent $d_0(k)$ in a so-called thermometer code.

Figure 6:
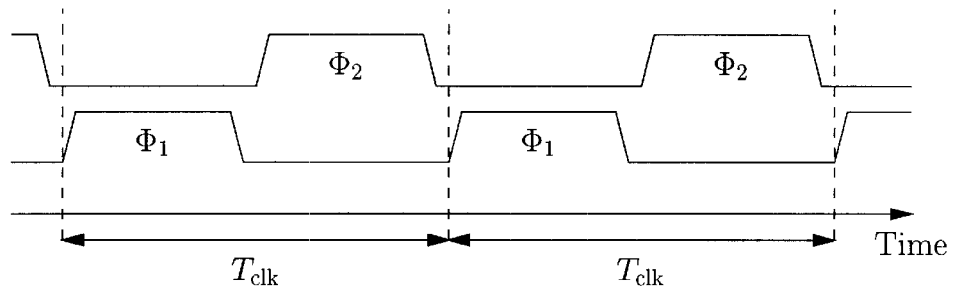

The DAC is implemented by a voltage buffer [64], buffering each of the four boolean signals to plus/minus the reference voltage ($\pm V_{ref}$), and an array of nominally identical capacitors [66]. The DAC capacitors [66] and the gain-scaling capacitor [68] also sample the input signal's g(t) value g(k) when the sampling switch [70] is opened at the end of clock phase $\Phi_1$, at which time the flash quantizer [52] is also strobed. The non-overlapping periodic clock phases are shown in FIG. 6. The residue signal $r_0(k)$ is represented by the operational amplifier's [72] (opamp's) output voltage at the end of clock phases $\Phi_2$. The gain factor $A_0$, which here is set to be 4, is determined by one plus the ratio of the DAC capacitors' [66] total capacitance divided by the gain-scaling capacitor's [68] capacitance.

Linearity.

It is assumed that the reference voltages, $\pm V_{ref}$, are well-regulated, which is achievable when using proper circuit techniques. DAC nonlinearity can thus be caused only by mutual mismatch of the nominally identical DAC capacitors [66], which in a traditional pipeline ADC [50] generally will be the dominating source of nonlinear errors. The DAC's linearity will largely be inversely proportional to the relative standard deviation $\sigma_{DAC}/C_{DAC}$ of the DAC capacitors' [66] total capacitance $C_{DAC}$ FIG. 7 shows the fast-Fourier transformed (FFT) of $d_g(k)$, when g(k) is a full-scale two-tone signal in the neighborhood of $\frac{1}{10}$ of the Nyquist frequency; only thermal noise from the sampling operation and mismatch of the DAC capacitors [66] have been accounted for in this simulation. The Figure is based on an estimated value of $\sigma_{DAC}/C_{DAC}=0.00038$ for $C_{DAC}=1$ pF (pico-Farad), which is a representative value for many modern CMOS technologies.

Spurious tones, i.e., harmonic and intermodulation distortion, with a power of up to about −77 dB relative to $V_{ref}^2$, are observed. It should be understood that FIG. 7 shows the frequency spectrum obtained by averaging of several experiments based on the same stochastic process. The performance of the worst ADCs from a production with a 99% yield will be about 10 dB worse. In other words, $20\log_{10}(\Phi_{DAC}/C_{DAC}) \cong 68$ dB, which corresponds to an effective linearity of about 11 bits, is a more realistic estimate of the worst-case linearity of the considered pipeline ADC circuit [50] with a reasonable yield.

It is a fundamental statistical property, which is valid for virtually any technology when using good layout techniques and $C_{DAC}$ is not too small, that $\Phi_{DAC}/C_{DAC}$ will be inversely proportional to $\sqrt{C_{DAC}}$. Hence, the ADC's effective linearity can be improved by, say, 3 bits simply by increasing $C_{DAC}$ by a factor of 64. Unfortunately, in doing so, the circuit's power consumption will also be increased by the same factor of 64. Hence, increasing $C_{DAC}$ is not a very attractive way to improve the linearity, especially not for ADCs intended for use in battery-powered equipment. Mismatch of $A_{0A}$ and $A_{0D}$ (or equivalently, mismatch of $K_0$ and $K_1$) is another potential source of significant nonlinearities. A gain-mismatch-induced error $$d_e(k) = \frac{r_0(k)}{K_0} \cdot \left[ \frac{A_{0A}}{A_{0D}} \frac{K_0}{K_1} - 1 \right]$$

will be comprised in the output signal $d_g(k)$. Considering that $d_e(k)$ and $r_0(k)$ are proportional, and that $r_0(k)$ is a highly-nonlinear function of g (k) (see FIGS. 2 and 3) it is concluded that the magnitude of $d_e(k)$ should be at most one least-significant bit. The magnitude of $d_e(k)$ can be reduced by reducing the magnitude of $r_0(k)$, i.e., by increasing the first flash quantizer's [52] resolution, or by reducing the mismatch factor: $(A_{0A}/A_{0D}) \cdot (K_0/K_1) - 1$. The effect of the DAC-gain mismatch factor, $K_0/K_1$, will usually be very small and can be neglected. Thus, the 3σ-value of the mismatch factor will be approximately $\sqrt{A_0} \cdot 3 \cdot \sigma_{DAC}/C_{DAC}$. Defining N as the first-stage flash quantizer's resolution in levels, it follows that the relative magnitude of $r_0(k)$ is 1/N. Hence, errors due to mismatch of the DAC capacitors [66] will generally be the dominating source of nonlinear errors if N is 9 or greater. However, if the errors due to mismatch of the DAC capacitors [66] somehow can be eliminated (which is one aspect of this invention), it follows that N will have to be impractically large to achieve an effective linearity of, say, 14 bits or more, unless $C_{DAC}$ is very large.

3 SUMMARY

Analog-to-digital converters implemented according to this invention comprise a first dithered quantizer generating a first estimate $d_0(k)$ of the analog input signal, a compensation stage generating a compensation signal $d_{r0}(k)$, and a digital circuit combining $d_0(k)$ and $d_{r0}(k)$ to form an output signal $d_g(k)$ representing the analog input signal.

3.1 Objects and Advantages

Accordingly, several objects and advantages of this invention are:

- to provide low-cost highly-linear analog-to-digital converters (ADCs) suitable for use in demanding systems, such as audio applications and xDSL modems;
- to provide highly-linear ADCs, the linearity of which do not rely on highly-accurate matching or control of electrical parameters;
- to provide highly-linear ADCs with a low power consumption;
- to provide highly-linear ADCs with a wide bandwidth;
- to provide ADCs with a good long-term performance reliability;
- to provide ADCs which are comparable to pipeline ADCs in terms of circuit complexity, but which have a superior linearity;
- to provide highly-accurate wide-bandwidth ADCs, for which the robustness to mismatch, including mismatch of transfer functions, is very good;
- to provide ADCs where dominating nonlinearities are made subject to a stochastic process converting harmonic and intermodulation distortion into a noise-like error signal, which generally is preferable in comparison to deterministic errors (i.e., distortion);
- to provide ADCs optimized with respect to the environment in which digital-subscriber-line modems operate;
- to provide ADCs which are optimized for the conversion of signals (as opposed to the conversion of an uncorrelated stream of data), which is the cornerstone of many digital communication systems.
- to provide ADCs which can tolerate more latch latency than traditional pipeline ADCs, thereby increasing the maximum sampling rate and reducing the bit-error-rate;

to provide a multi-step A/D conversion technique where the input signal g(t) is not sampled at the input, which allows for a superior noise performance.

Further objects and advantages will become apparent from a consideration of the ensuing description, the drawings, and the claims.

4 DRAWING FIGURES

FIG. 1: shows a 5-stage pipeline quantizer (Prior Art).

FIG. 2: shows the amplified residue characteristic for an ideal 5-level quantizer (Prior Art).

Figure 3:
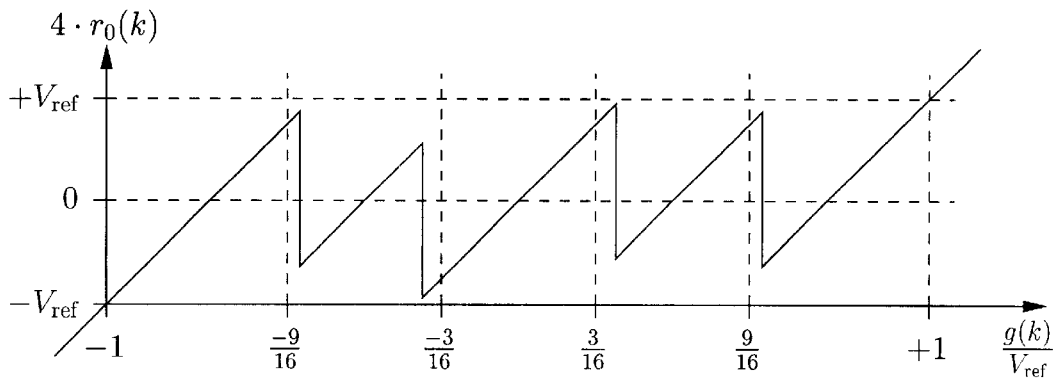

FIG. 3: shows the amplified residue characteristic for a more typical (non-ideal) 5-level quantizer (Prior Art).

FIG. 4: shows a simplified representation of the pipeline ADC from FIG. 1 (Prior Art).

FIG. 5: shows an implementation of a pipeline ADC's input stage employing a 5-level flash quantizer (Prior Art).

FIG. 6: shows the non-overlapping clock phases used for the input stage shown in FIG. 5 (Prior Art).

FIG. 7: shows the FFT of the output signal generated by a traditional pipeline ADC subject to thermal noise and DAC nonlinearity (Prior Art).

Figure 8:
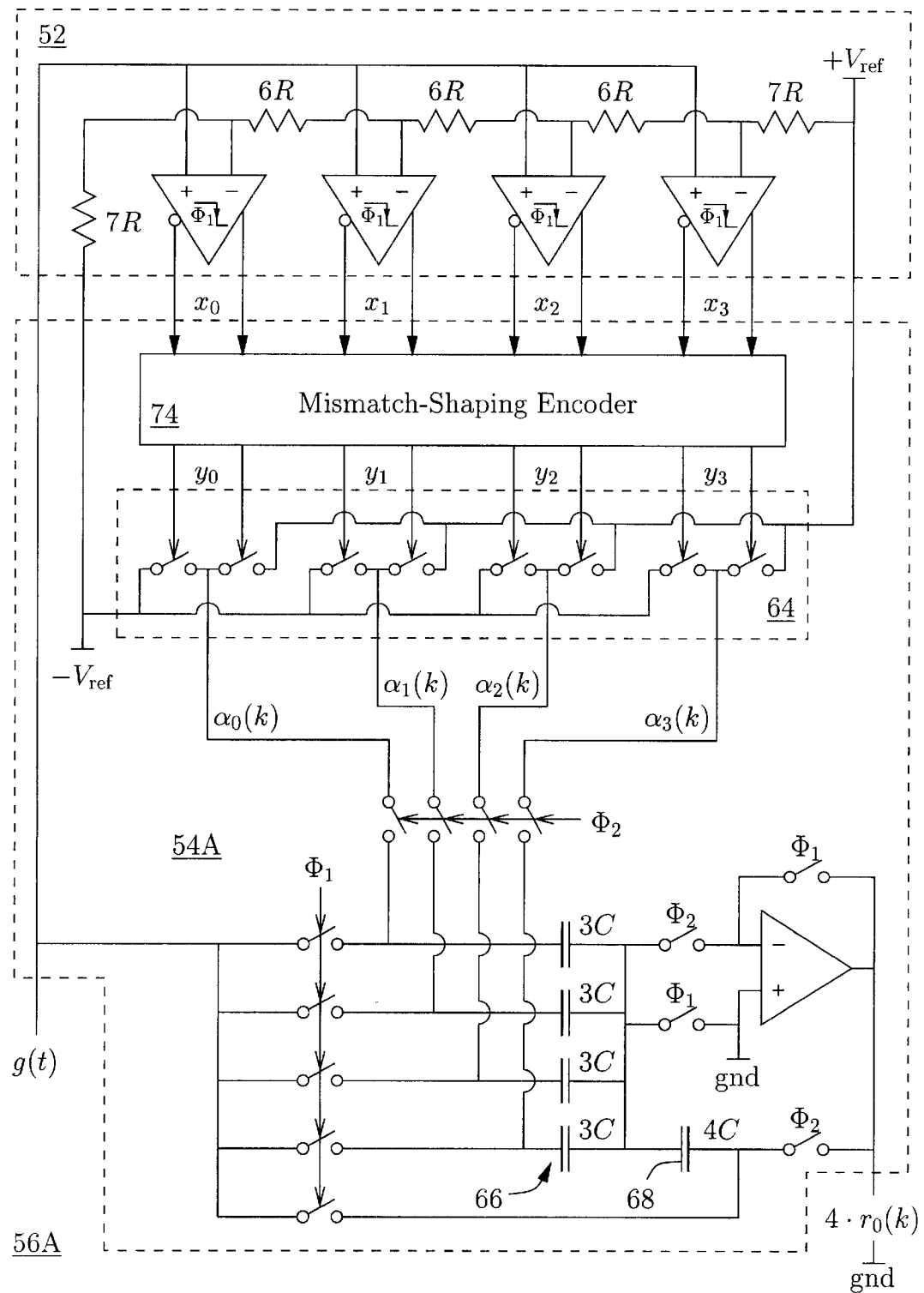

FIG. 8: shows the input stage of a pipeline ADC where a mismatch-shaping encoder is inserted between the flash quantizer and the feedback DAC.

FIG. 9: shows a digital multiplexer circuit used in the mismatch-shaping encoder shown in FIG. 8.

FIG. 10: shows the truth table for the digital multiplexer circuit shown in FIG. 9.

Figure 11:
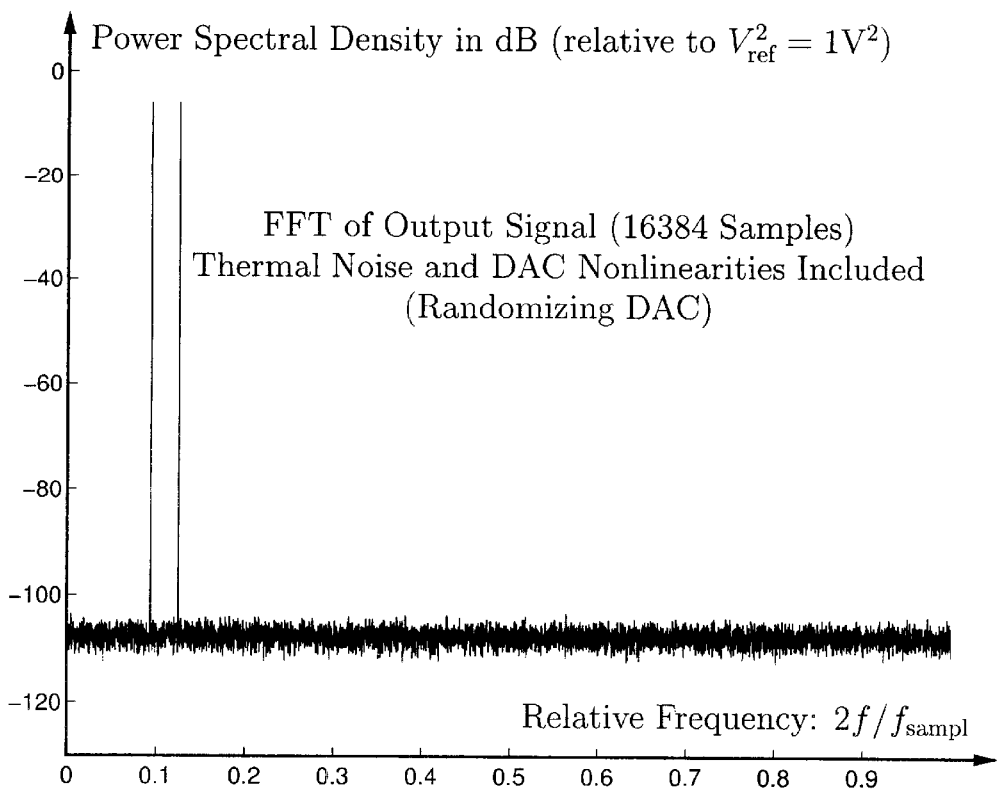

FIG. 11: shows the FFT of the output signal generated by a pipeline ADC employing a zero-order mismatch-shaping encoder to randomize mismatch-induced errors.

Figure 12:
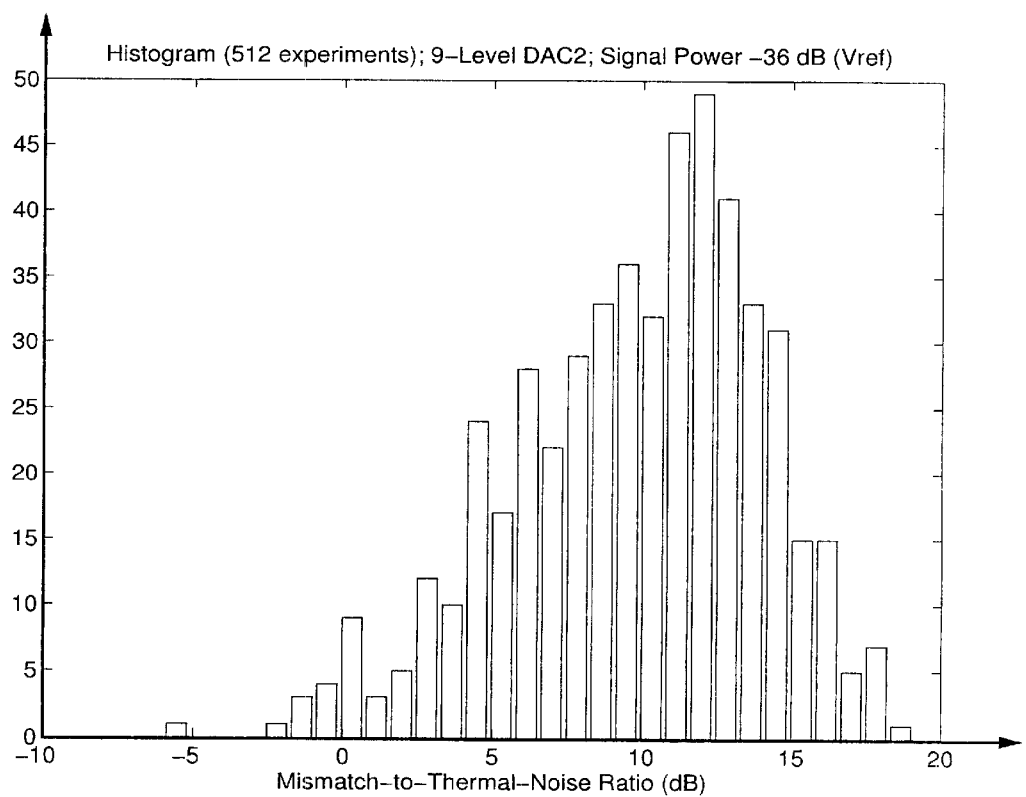

FIG. 12: shows a histogram for the ratio of the mismatch-induced error's total power divided by the thermal noise's total power (based on 512 independent experiments).

Figure 13:
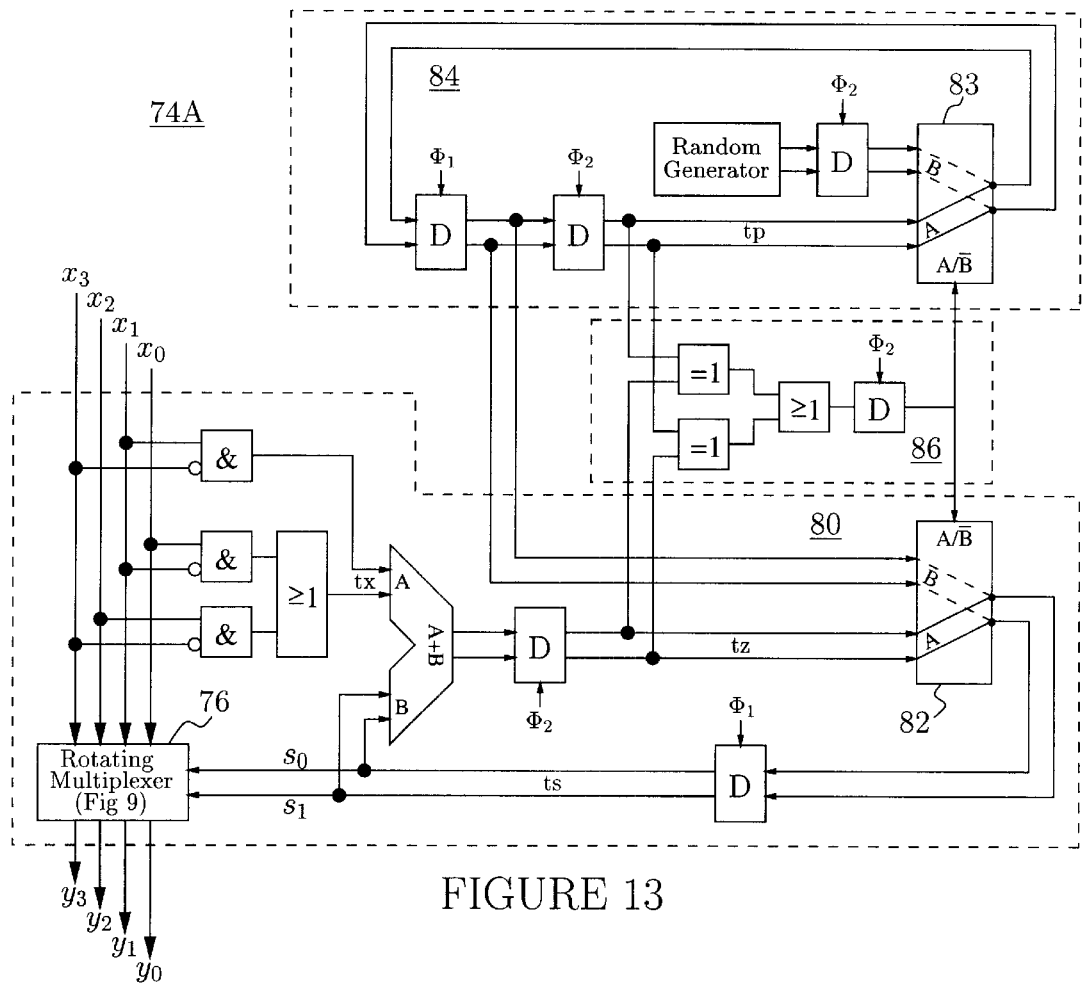

FIG. 13: shows an idle-tone-free first-order mismatch-shaping encoder.

Figure 14:
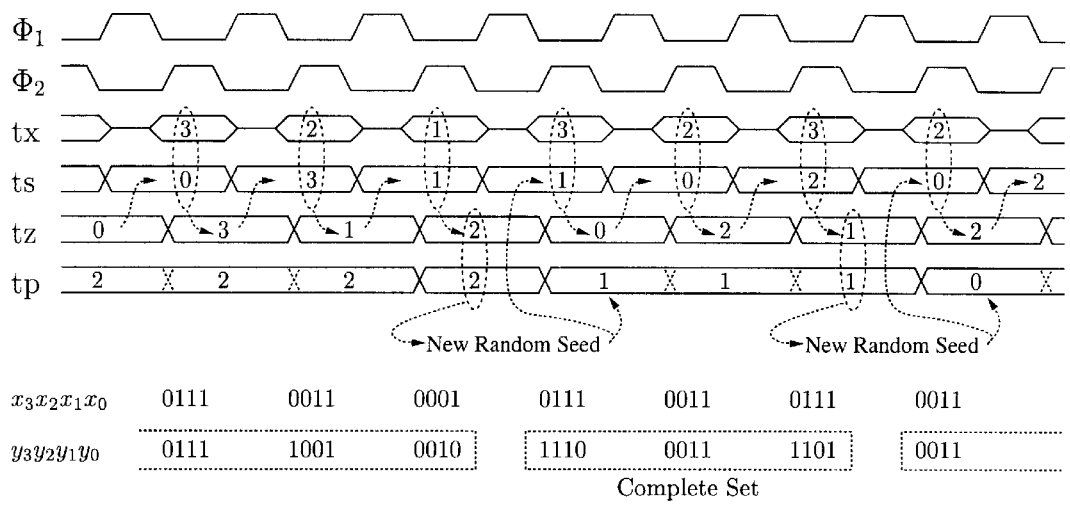

FIG. 14: shows a timing diagram example for the encoder shown in FIG. 13.

Figure 15:
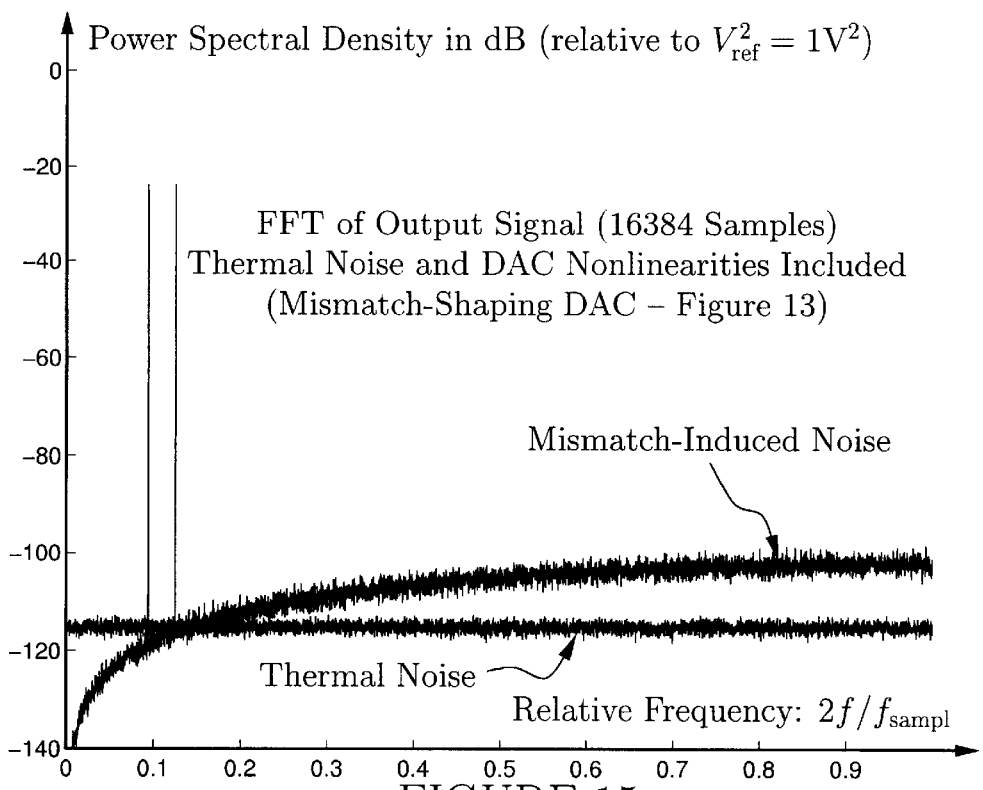

FIG. 15: shows the FFT of the output signal generated by a pipeline ADC employing an idle-tone-free first-order mismatch-shaping encoder to randomize mismatch-induced errors; the thermal noise is shown separately.

Figure 16:
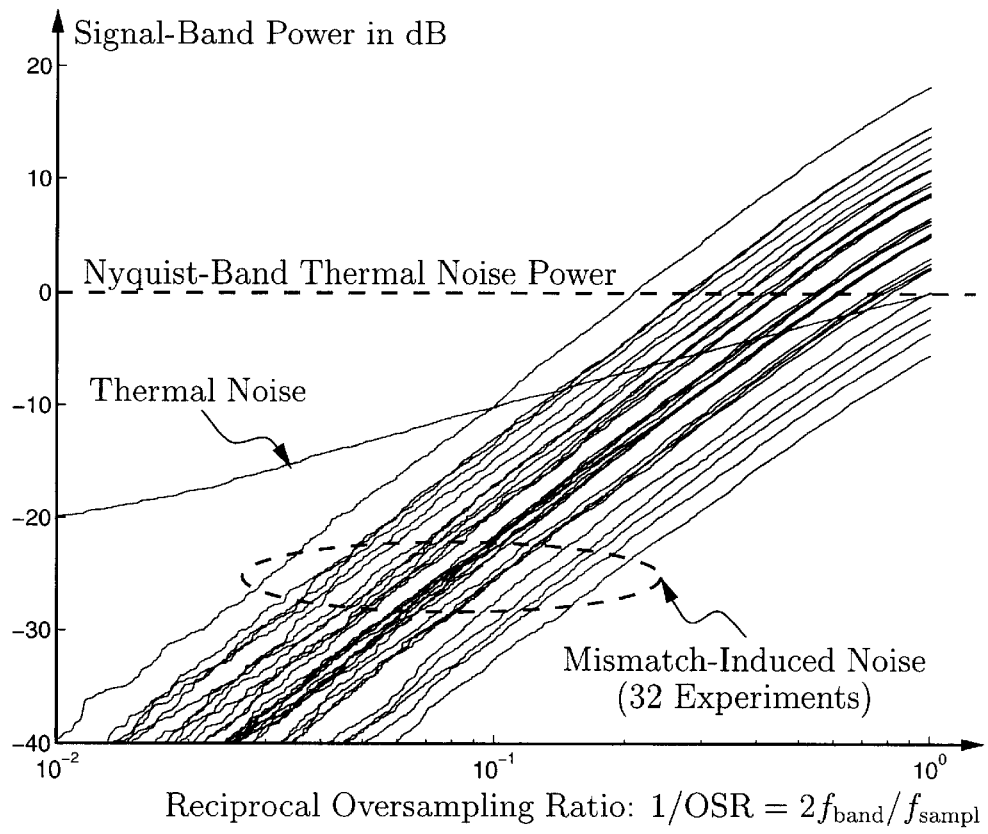

FIG. 16: shows separately the signal-band power of the thermal noise and mismatch-induced noise for a pipeline ADC employing an idle-tone-free first-order mismatch-shaping encoder (the Figure is based on 32 independent experiments).

Figure 17:
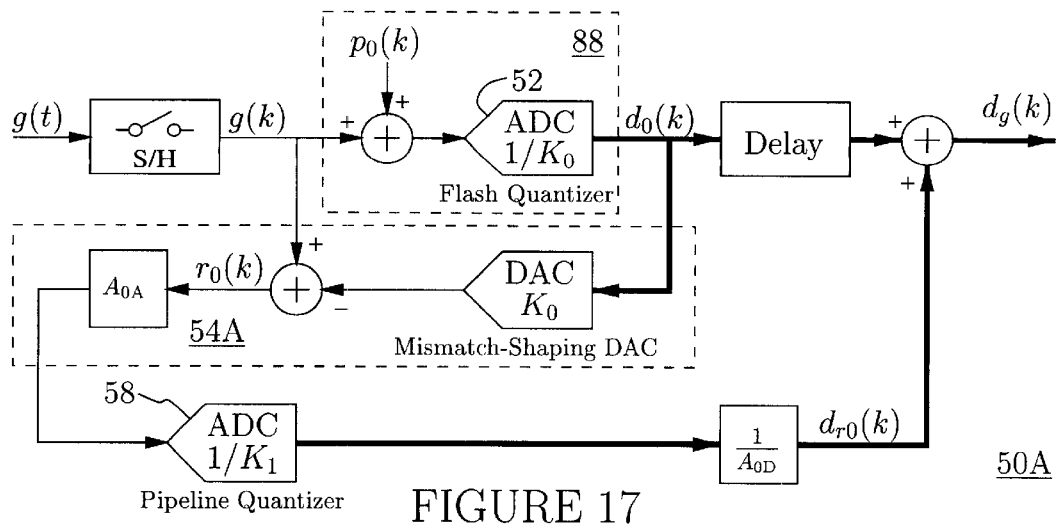

FIG. 17: shows a pipeline ADC where the first flash quantizer is dithered with a random signal.

Figure 18:
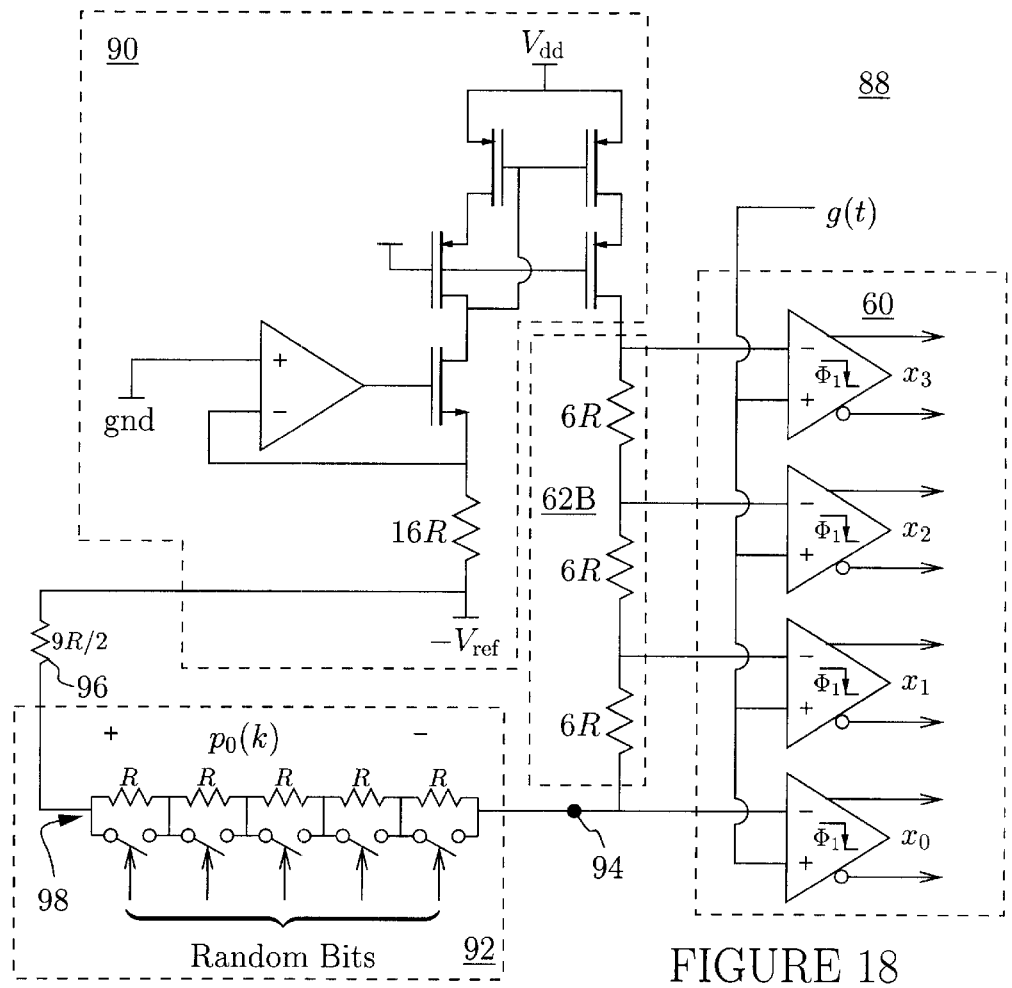

FIG. 18: shows an implementation of a flash quantizer dithered with a random signal.

Figure 19:
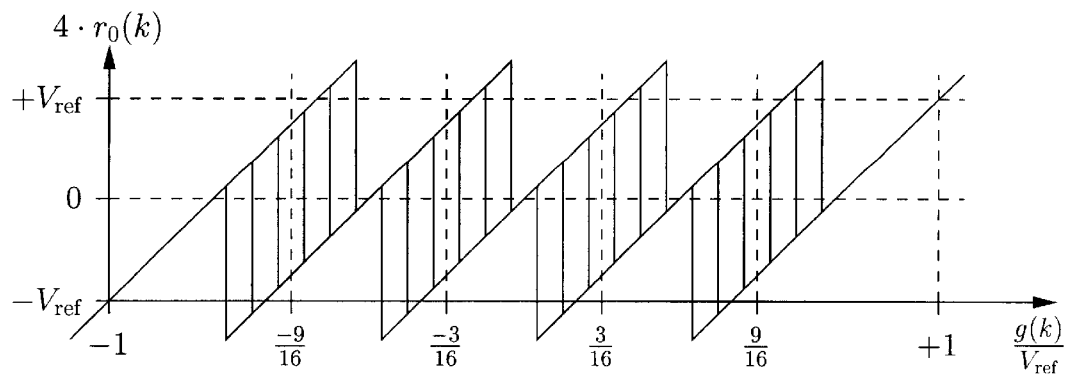

FIG. 19: shows the randomized residue characteristic for the dithered flash quantizer shown in FIG. 18.

Figure 20:
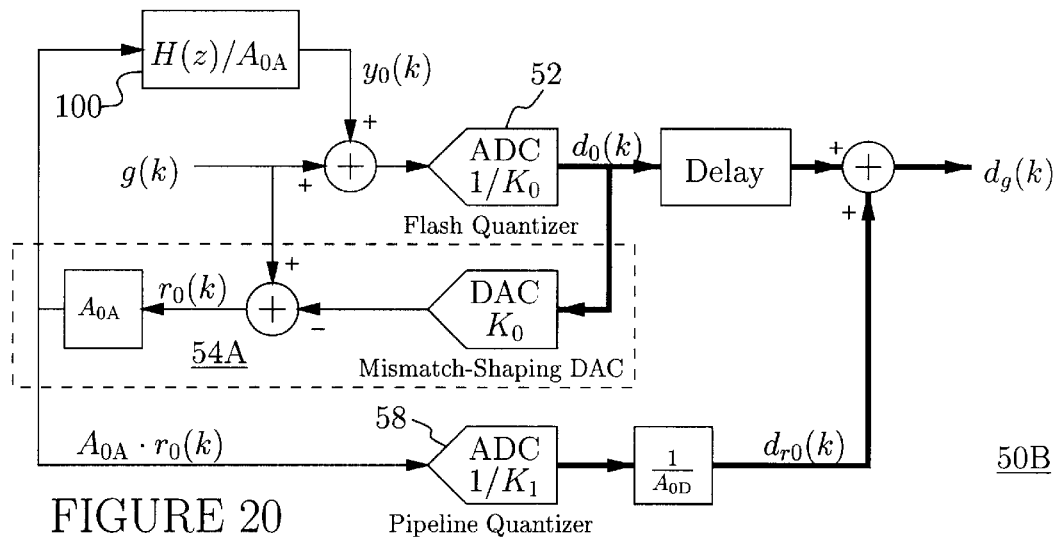

FIG. 20: shows a pipeline ADC circuit where the first flash quantizer is dithered with a signal generated by selectively amplifying the residue signal in a selected frequency range.

Figure 21:
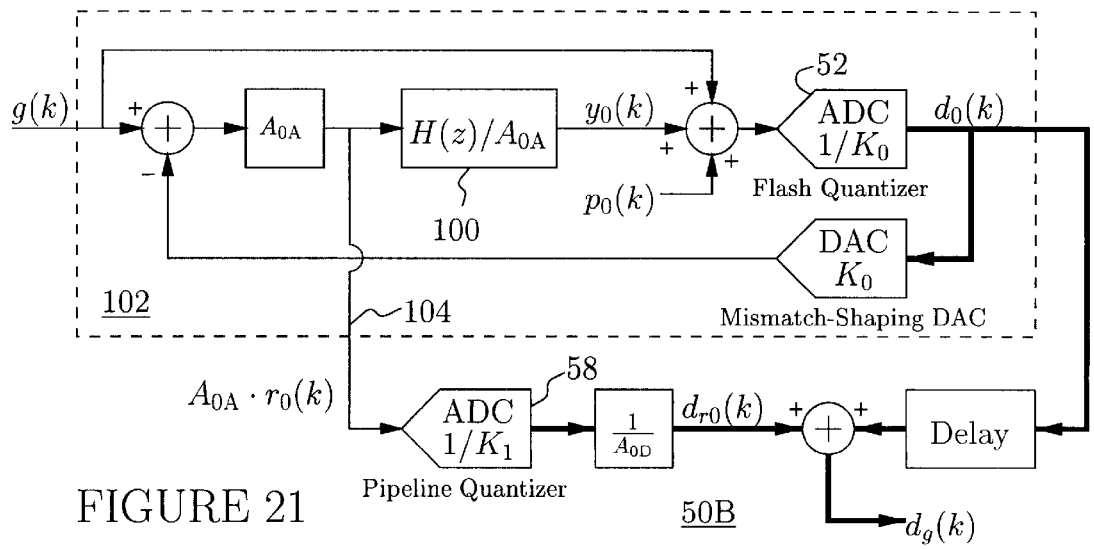

FIG. 21: shows the same circuit as FIG. 20, however, drawn differently to emphasize the underlying delta-sigma modulator topology.

Figure 22:
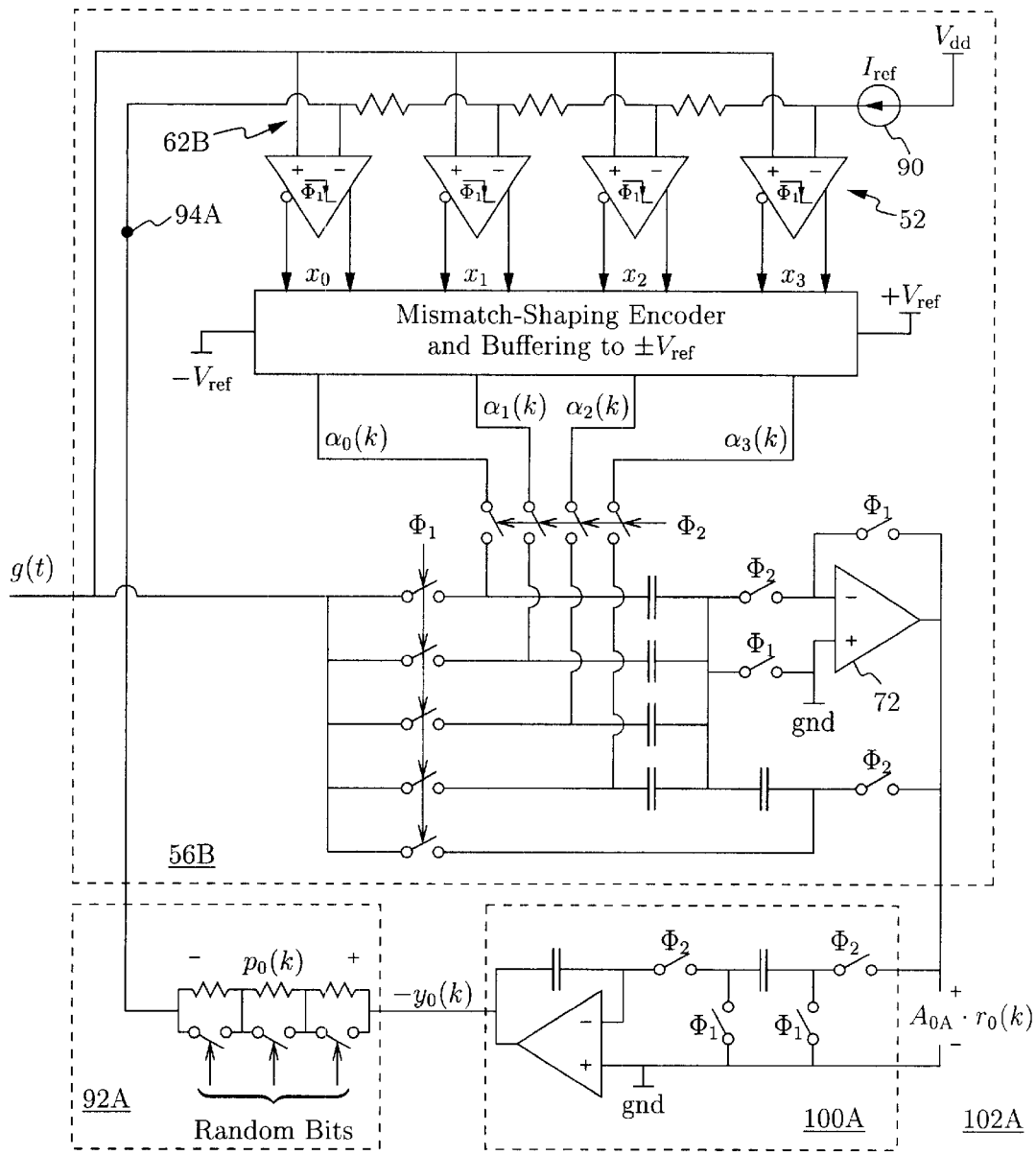

FIG. 22: shows an implementation of the input stage of the ADC shown in FIG. 21 employing a simple first-order loop filter.

Figure 23:
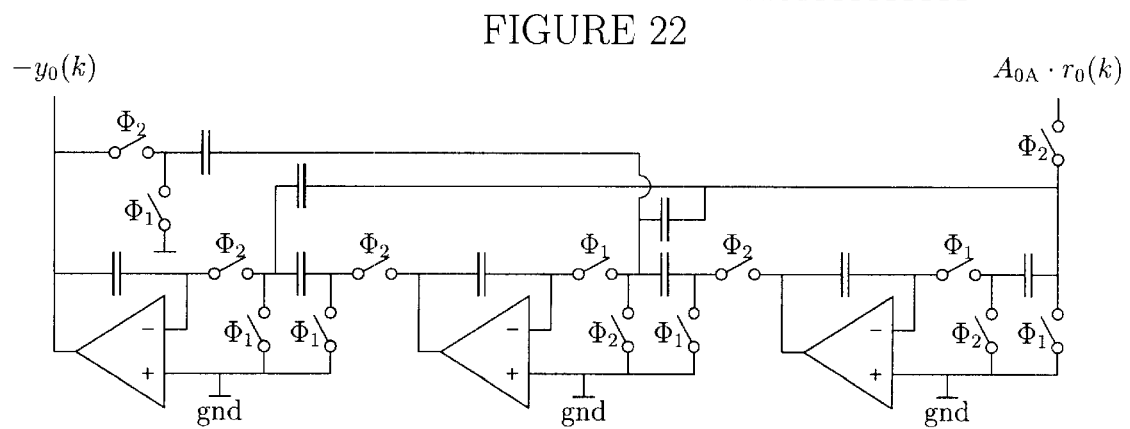

FIG. 23: shows a third-order filter which can be used in place of the first-order filter employed in FIG. 22.

Figure 24:
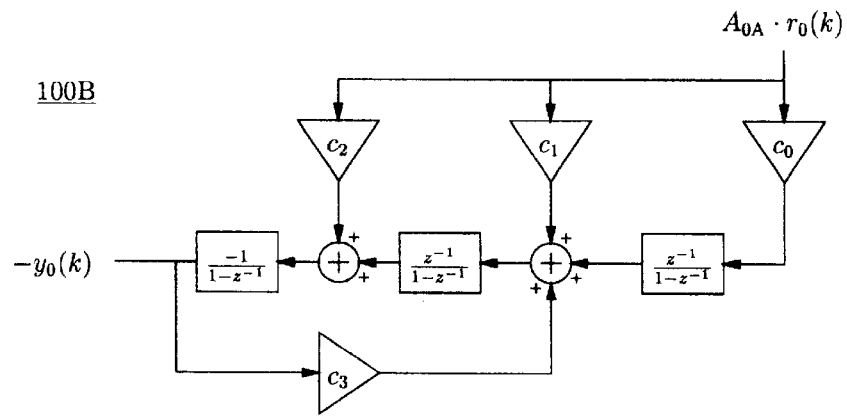

FIG. 24: shows a block diagram of the third-order filter shown in FIG. 23.

Figure 25:
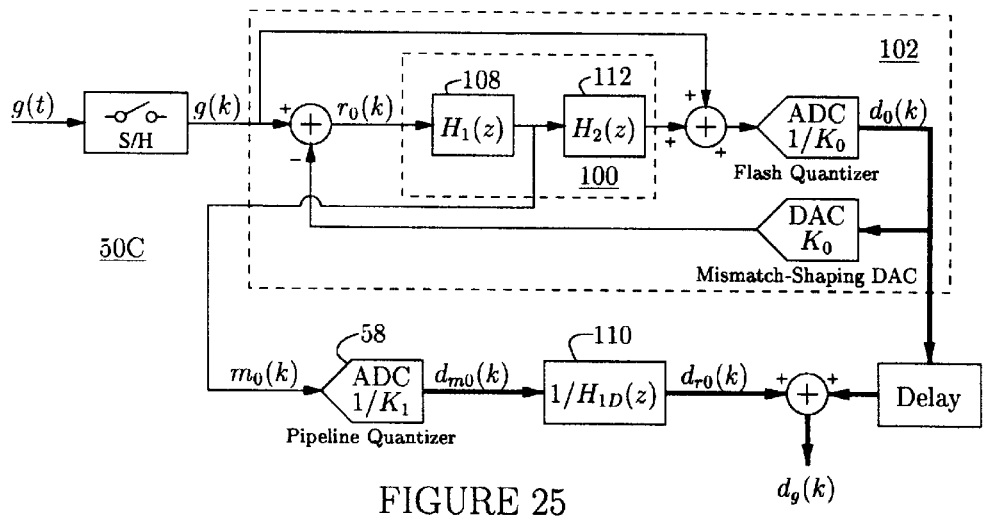

FIG. 25: shows an indirectly-residue-compensated delta-sigma ADC.

Figure 26:
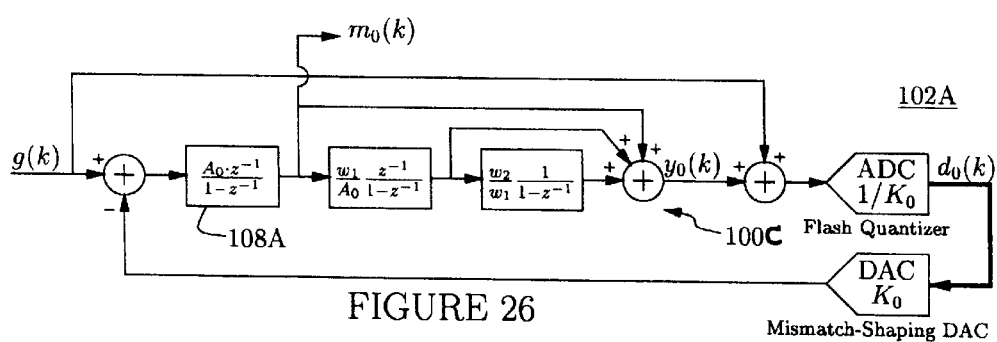

FIG. 26: shows a block diagram of how the first stage of the ADC from FIG. 25 can be implemented.

Figure 27:
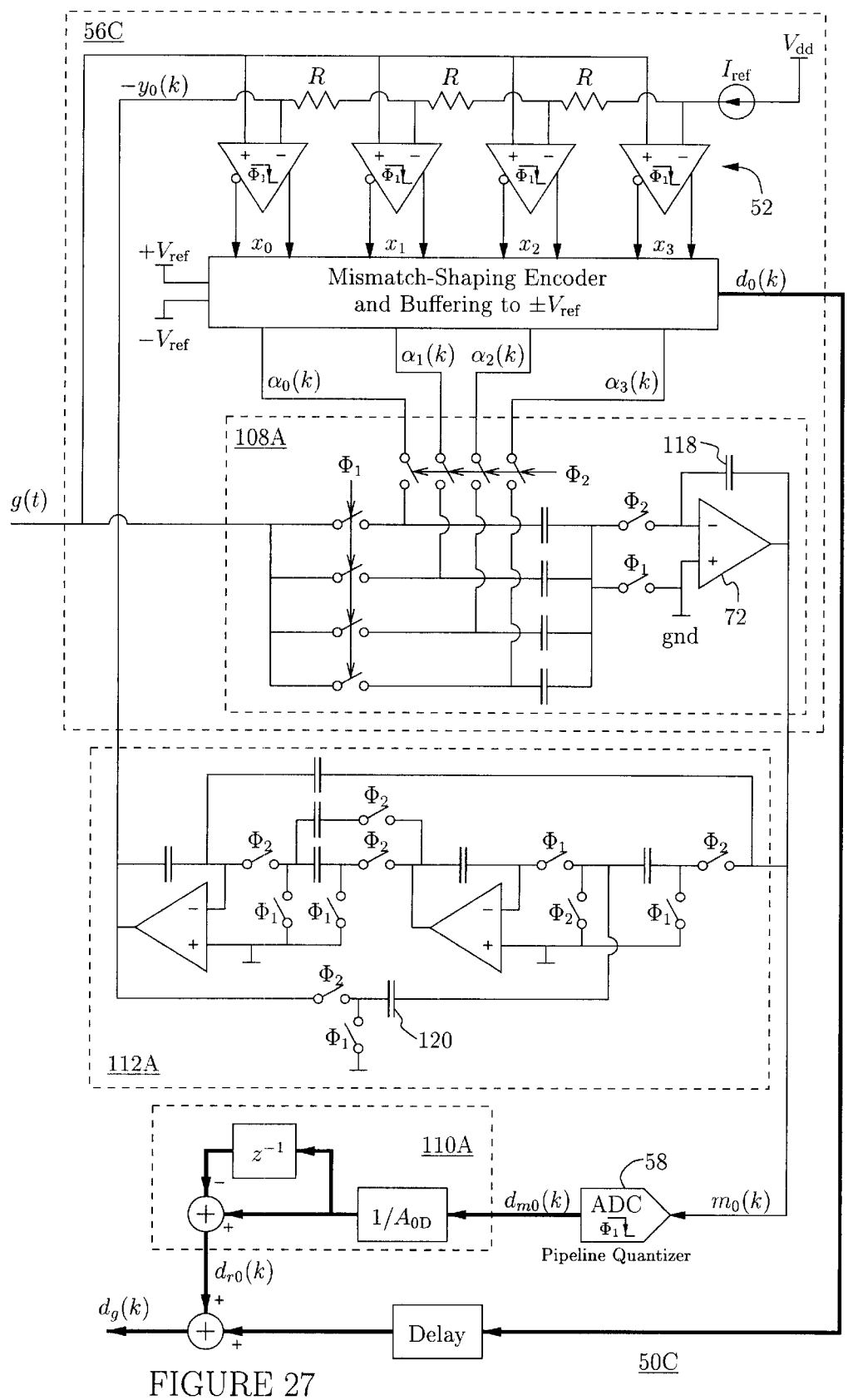

FIG. 27: shows an implementation of the ADC from FIGS. 25 and 26.

Figure 28:
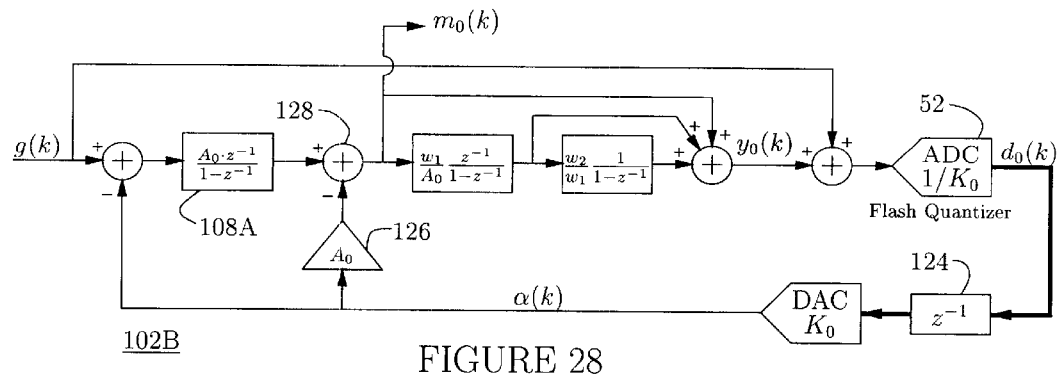

FIG. 28: shows a first example of how the ADC from FIG. 25 can be allowed one (extra) clock cycle of latency in the global loop.

Figure 29:
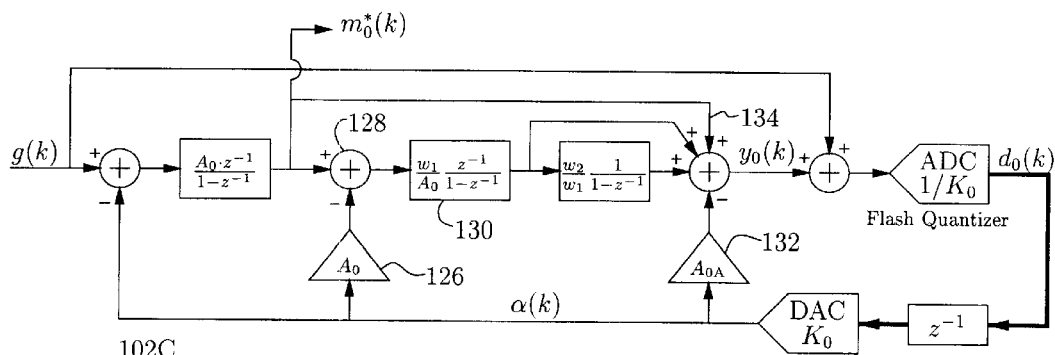

FIG. 29: shows a simpler-to-implement version of the block diagram shown in FIG. 28.

Figure 30:
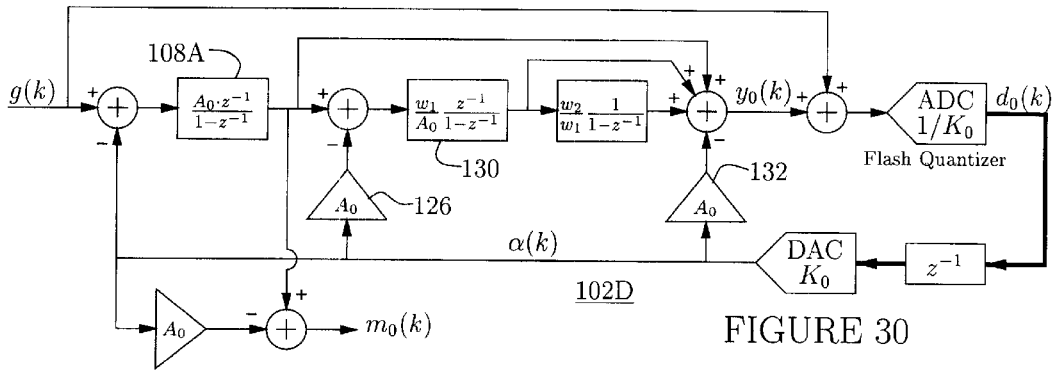

FIG. 30: shows an improved version of the block diagram from FIG. 29.

Figure 31:
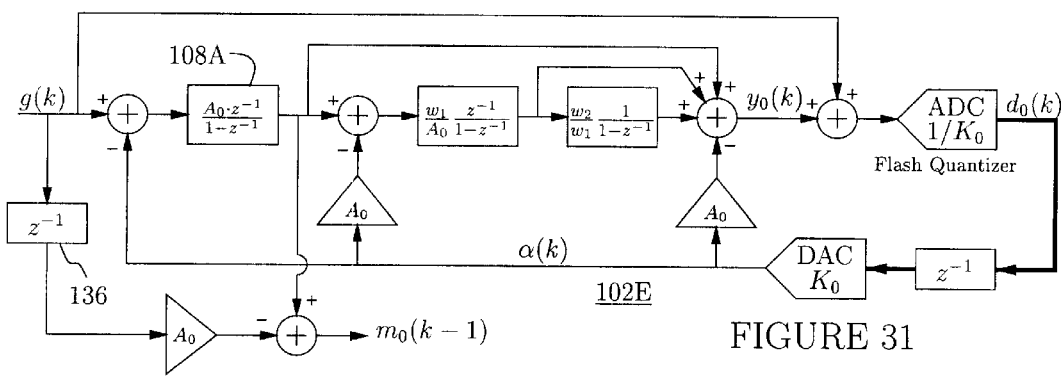

FIG. 31: shows an alternative version of the block diagram shown in FIG. 30.

Figure 32:
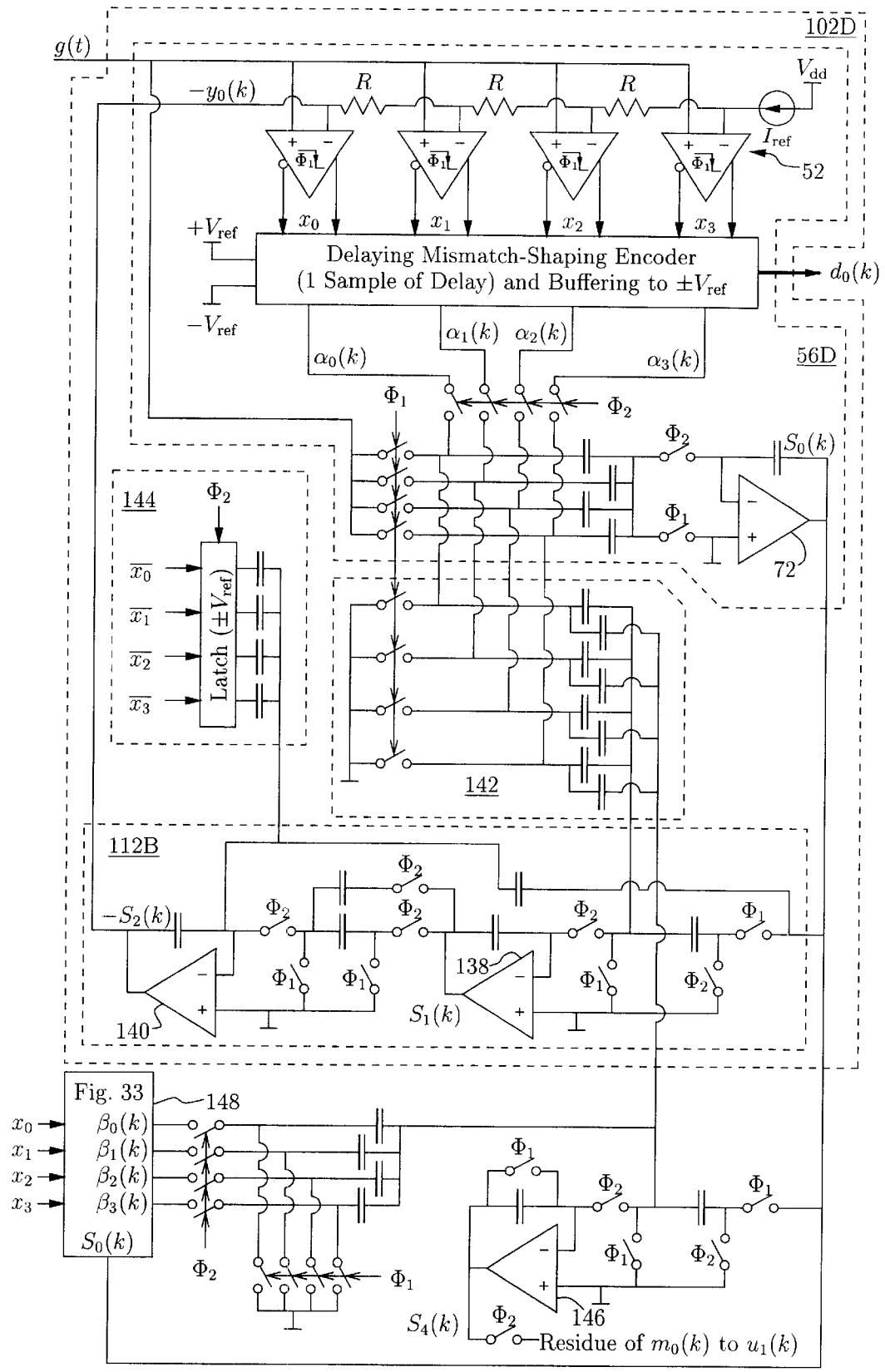

FIG. 32: shows an implementation of the block diagram from FIG. 30.

Figure 33:
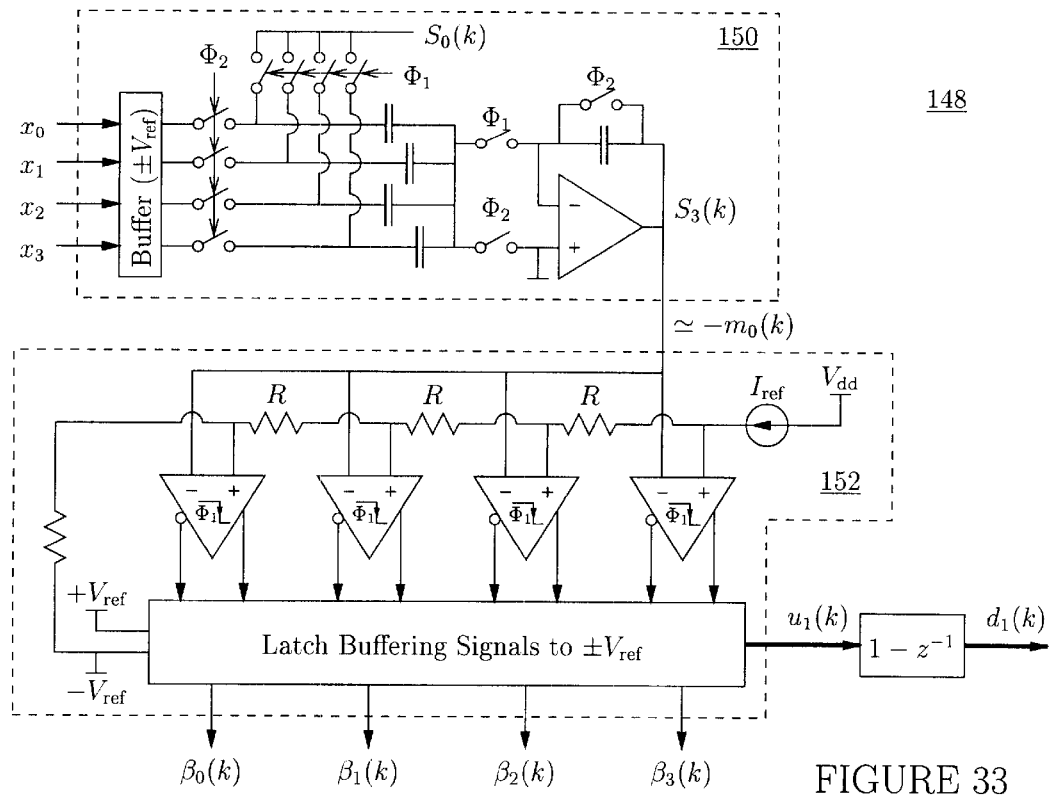

FIG. 33: shows a subcircuit employed in FIG. 32.

Figure 34A:
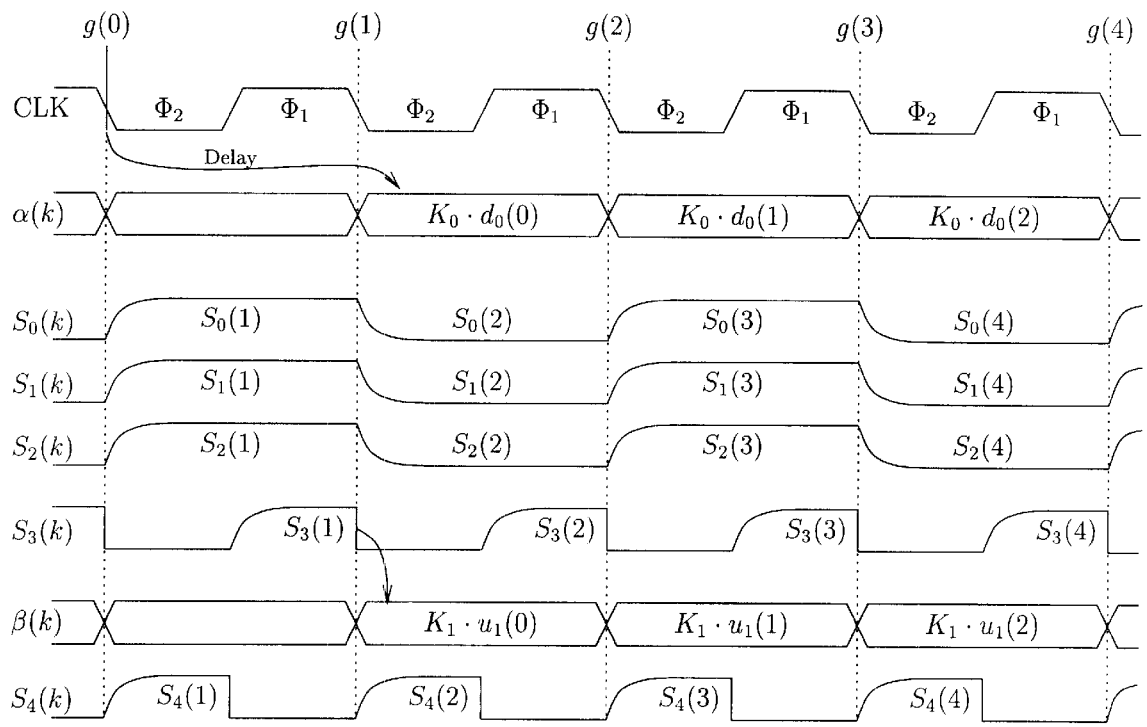

FIG. 34A: shows a timing diagram for the circuit shown in FIGS. 32 and 33.

FIG. 34B: shows mathematical equations for some of the signals represented in FIG. 34A.

FIG. 34C: shows the first few values of some of the signals represented in FIG. 34A.

FIG. 35: shows the general topology for residue-compensating ADCs implemented according to this invention.

Figure 36:
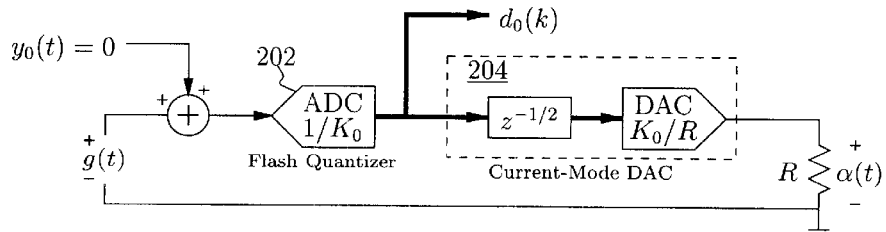

FIG. 36: shows a flash quantizer followed by a delaying current-mode DAC interfacing a matched output impedance.

Figure 37A:
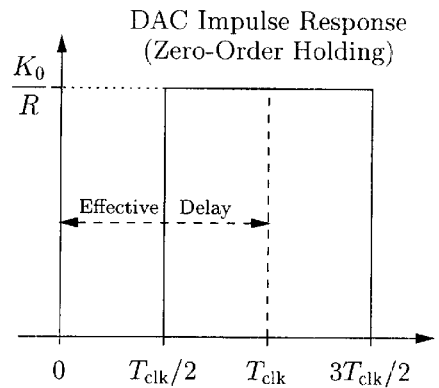

FIG. 37A: shows the delaying zero-order-holding impulse response of a current-mode DAC.

Figure 37B:
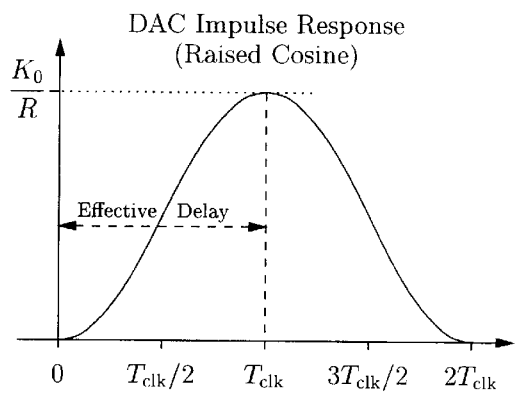

FIG. 37B: shows the delaying raised-cosine impulse response of a current-mode DAC.

Figure 38:
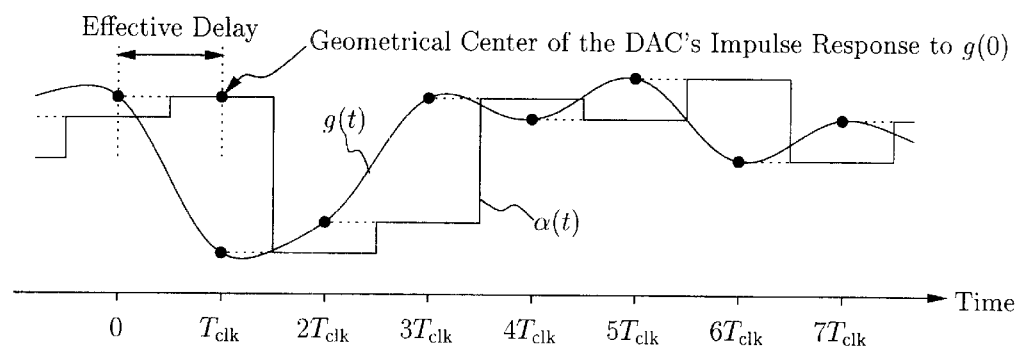

FIG. 38: shows the input/output relationship (example) for the circuit shown in FIG. 36 when the DAC is described by the delayed zero-order-holding impulse response shown in FIG. 37A.

Figure 39:
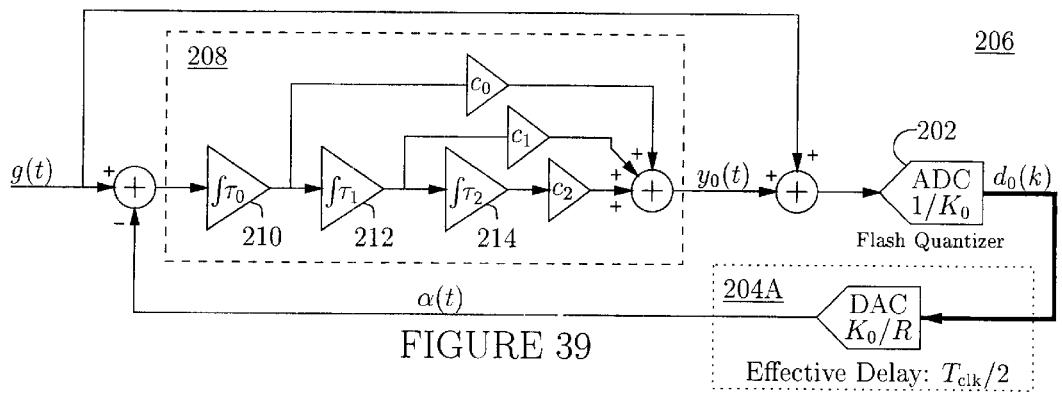

FIG. 39: shows a continuous-time delta-sigma modulator circuit.

Figure 40:
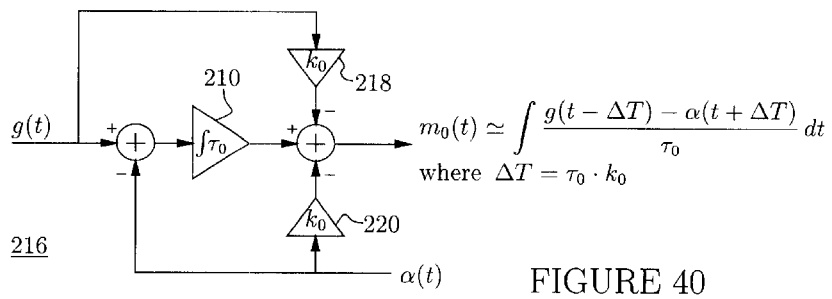

FIG. 40: shows how extra signal paths can be used to compensate for delay.

Figure 41:
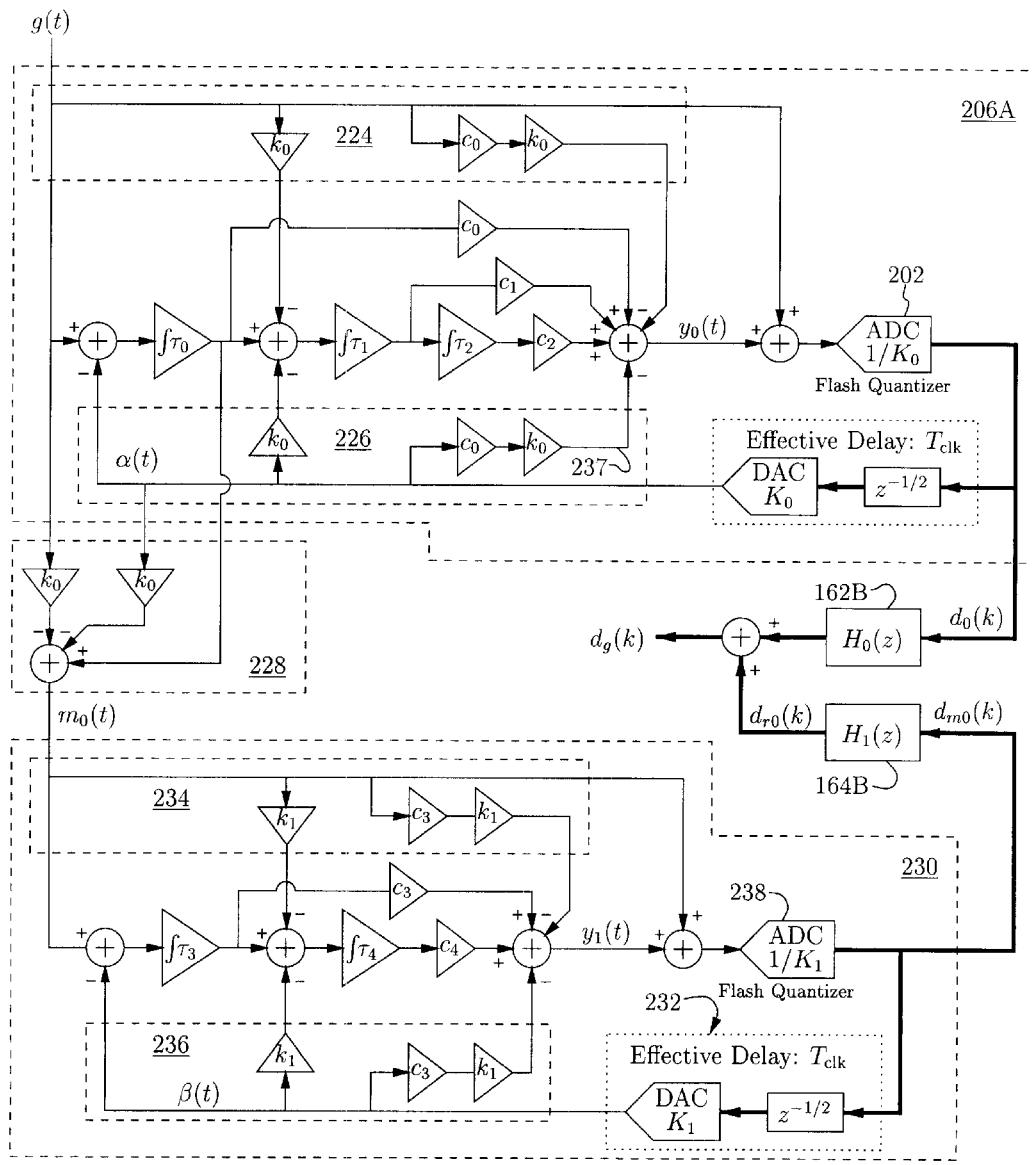

FIG. 41: shows a block diagram for a two-step indirectly-residue-compensating continuous-time delta-sigma modulator, which in both stages employs the delay-compensating technique illustrated in FIG. 40.

Figure 42A:
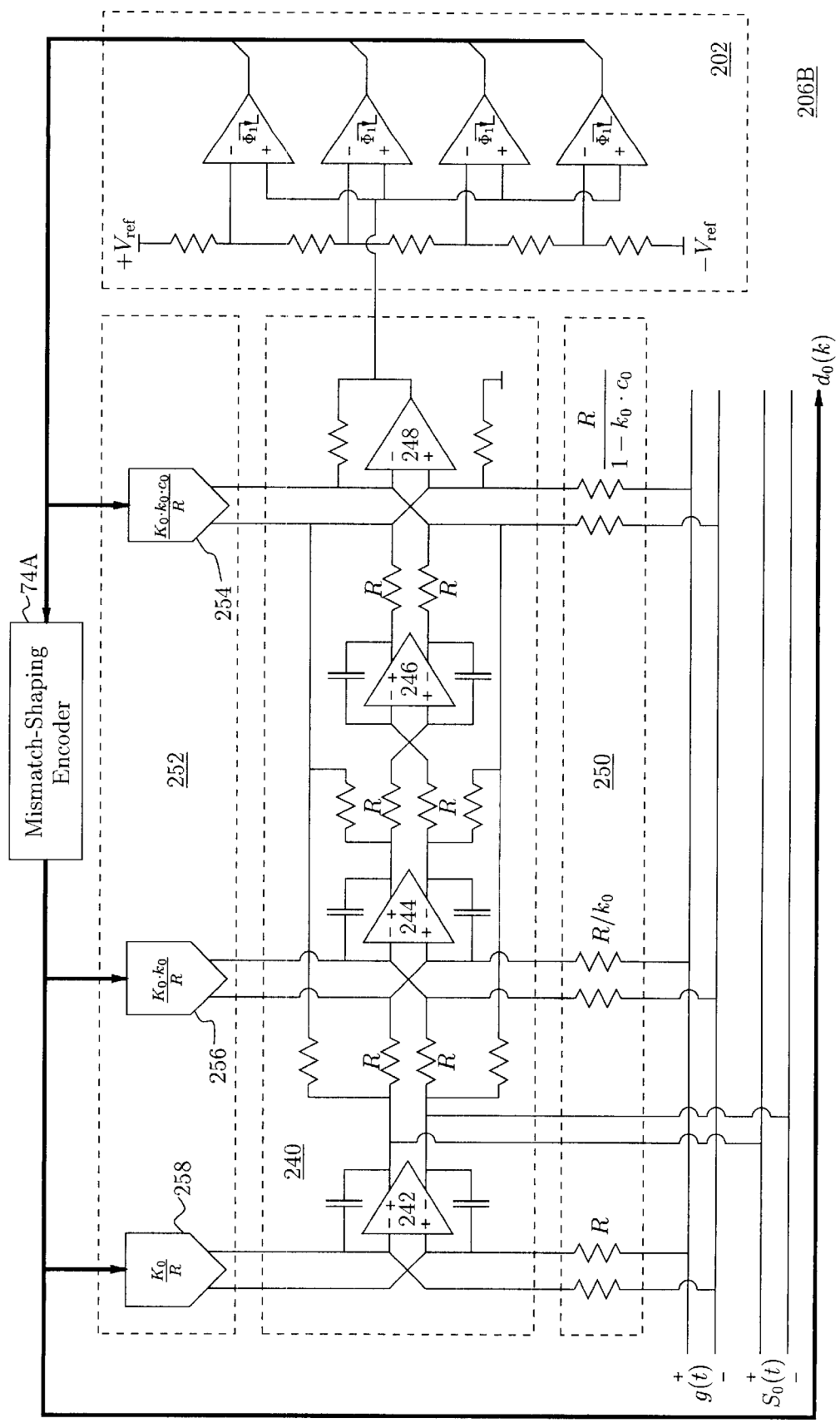

FIG. 42A: shows a circuit-level implementation of the first stage of the ADC shown in FIG. 41.

Figure 42B:
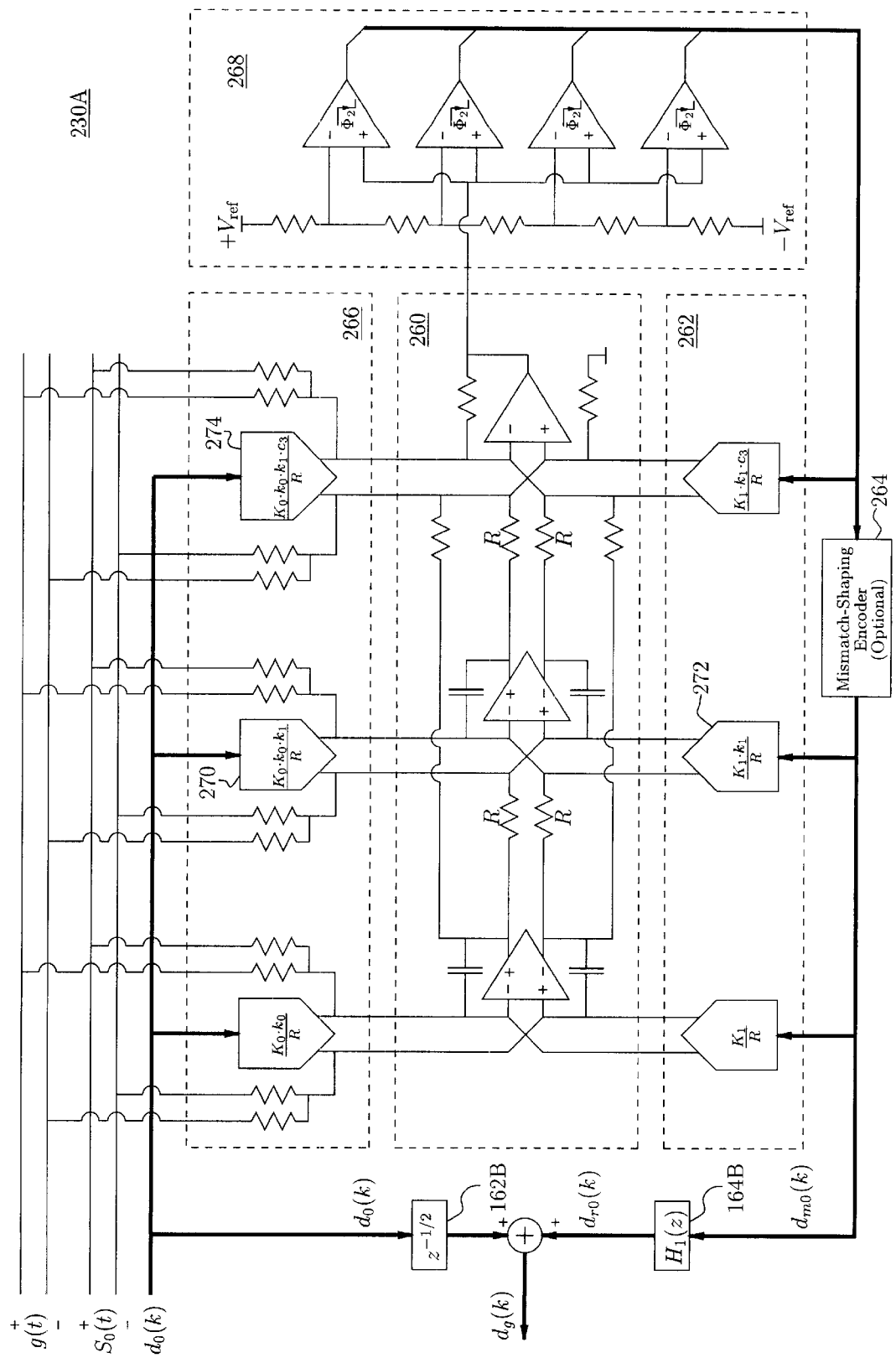

FIG. 42B: shows a circuit-level implementation of the second stage of the ADC shown in FIG. 41.

5 DESCRIPTION OF PREFERRED EMBODIMENTS

This invention has several important embodiments, which individually can be considered to be more or less fully-optimized versions of the pipeline ADC circuit [50] shown in FIG. 4. The below disclosure of the invention will take the form of gradually optimizing and improving the pipeline ADC circuit [50].

As discussed above, mismatch of the DAC capacitors [66] will generally be the cause of the dominating nonlinear errors in a well-designed pipeline ADC circuit [50]. The frequency-domain effects of these nonlinear errors were shown in FIG. 7. This distortion component will now be compared to the thermal noise contents.

Thermal Noise.

All switched-capacitor circuits are subject to a substantial thermal noise component, which is also represented (accounted for) in the frequency spectrum shown in FIG. 7. There are only three ways to improve the thermal noise performance: 1) increase the maximum signal swing by increasing the reference voltage difference $\pm V_{ref}$ (this technique is generally not viable because the reference voltage is constantly being reduced by constraints imposed by modern CMOS technologies' lower break-down voltages); 2) increase the effective sampling capacitance, i.e., the capacitance of the capacitors [66] and [68] (this technique is not very attractive because the power consumption will have to be doubled in order to reduce the thermal noise by a factor of two); or 3) increase the sampling frequency while maintaining the signal bandwidth, i.e., oversample the ADC circuit [50] (this technique is not very attractive neither because the power consumption will be increased by as much as when increasing the effective sampling capacitance to obtain the same reduction of the thermal noise). Hence, in conclusion, a reduced signal-to-thermal-noise ratio is imposed by the lower reference voltage, and it is quite expensive in terms of power to improve this parameter. Furthermore, it can be concluded that, provided that the sampling frequency is not extremely high, the signal-band thermal noise power will be inversely proportional to the ADC circuit's [50] power consumption. Because the signal-band thermal noise power for a given power consumption is largely independent of the oversampling ratio, a small degree of oversampling (say, 5–10 times) can be used for most applications at virtually no expense. One advantage among several advantages of using oversampling is that the requirements to the anti-aliasing filter (not shown), which generally will precede the ADC [50], will be relaxed.

It is an important observation that many applications are much less sensitive to thermal noise errors than they are to spurious tones, i.e., distortion errors. This observation is reflected by several (calibrated) ADC products currently on the market, which are claimed to have a linearity which is several bits better than their claimed noise performance. Such ADCs are usually intended for use in digital communication applications.

First Embodiment.

Consider FIG. 8, which shows a modified version [56A] of the pipeline ADC's [50] input stage [56]. The objective of the modified input stage [56A] is to uncorrelate from the input signal the errors caused by mismatch of the DAC capacitors [66], i.e., to convert distortion errors into a noise-like error signal. This objective is achieved by inserting a mismatch-shaping encoder [74] in between the flash quantizer [52] and the DAC's voltage buffer [64]. The mismatch-shaping encoder [74] merely interchanges the order of the four boolean values, $x_0$, $x_1$, $x_2$, and $x_3$, to generate another sequence, $y_0$, $y_1$, $y_2$, and $y_3$, of the same boolean values. In other words, $y_0 y_1 y_2 y_3$ is a permutation of $x_0 x_1 x_2 x_3$. The operation of permuting $x_0 x_1 x_2 x_3$ can, e.g., be performed by a rotating multiplexer circuit [76] shown in FIG. 9. The input sequence, $x_0 x_1 x_2 x_3$, is first rotated by either 0 or 2 places according to the value of a binary selector signal, $s_1$, and thereafter rotated by either 0 or 1 places according to the value of another binary selector signal, $s_0$. In other words, the output sequence, $y_0 y_1 y_2 y_3$, is generated by rotating the input sequence, $x_0 x_1 x_2 x_3$, by as many places as the value of the 2-bit binary word $s_1 s_0$ dictates (when interpreted in the unsigned binary number system). More precisely, the multiplexer circuit's [76] operation is described by the truth table shown in FIG. 10. To implement a zero-order mismatch-shaping encoder [74], the selector signals can be generated by a random generator (not shown) providing a new random value $s_1 s_0$ (0,1,2, or 3) in every sample. The statistical properties of the random generator need not be particularly good (encryption-grade randomness is not required); a simple linear-feedback-shift-register random generator can be used. Notice that this zero-order mismatch-shaping encoder is somewhat similar to the encoder proposed by Richard Carley in Journal of Solid-State Circuits in April 1989. However, extensive simulations indicate that the proposed encoder based on random rotation [76] is approximately 3 dB better than Carley's encoder based on random swapping, which at the system level corresponds to reducing the power consumption by a factor of two (assuming that this is the dominating error source).

FIG. 11 shows the frequency spectrum (FFT) of the output signal from a simulation of the pipeline ADC circuit [50] using the modified input stage [56A]. The simulation was based on the same conditions, and the input signal was the same as for the simulation represented by FIG. 7. Notice the total absence of spurious tones, i.e., harmonic and intermodulation distortion due to mismatch of the DAC capacitors [66] has been converted into a noise-like error signal, which is the desired result.

The mismatch-induced noise-like error signal, which hereinafter will be referred to as "mismatch-induced noise," unfortunately causes the noise floor to raise by approximately 10 dB. Although an ADC circuit providing the performance represented by FIG. 11 often is preferable to an ADC circuit providing the performance represented by FIG. 7, the increased noise contents is unfortunate because it reflects that the power consumption is significantly higher than it normally would need to be. It is a very interesting observation that the mismatch-induced noise and the thermal noise alike will be inversely proportional to the DAC capacitors' [66] total capacitance $C_{DAC}$ (here neglecting the gain-scaling capacitor [68], which generally is somewhat smaller than $C_{DAC}$). Thus, the factor by which the noise floor will increase due to the mismatch-induced noise depends only on the technology's matching index (i.e., $\sigma_{ref}/C_{ref} = \sigma_{DAC}/C_{DAC}$ for $C_{DAC}=C_{ref}=1$ pF) and the reference voltage $\pm V_{ref}$. The mismatch-induced noise's power will be proportional to both $\sigma_{ref}/C_{ref}$ and $V_{ref}$. In the below discussion, the values $\sigma_{ref}/C_{ref}=0.00038$ and $V_{ref}=1$ V will be used for numeric evaluations to exemplify the significant advantages of this invention.

Clearly, the mismatch-induced noise's power is a stochastic variable which will attain a fixed value for each implementation of the ADC circuit. FIG. 12 shows a histogram based on simulations made for 512 nominally-identical circuits (i.e., 512 independent events of the stochastic process). The histogram shows the ratio of the mismatch-induced noise's total (Nyquist-band) power divided by the thermal noise's total power. The simulations were based on a relatively small input signal, which was found to be the worst-case operating conditions. This histogram, and also the results from more than 10,000 other simulations of the ADC circuit operating under various other conditions (not shown), indicate that for a 99% yield, the mismatch-induced noise will be at most 19 dB higher than the thermal noise.

Recall that 19 dB variation in the noise contents corresponds to a factor of approximately 80 variation in the power consumption. Hence, it is clearly desirable to reduce the mismatch-induced noise to a level where the thermal noise dominates, in which case the power consumption will be minimal for a given noise level.

One way to avoid an increase in the noise floor is to calibrate the DAC capacitors [66], i.e., to reduce $\sigma_{DAC}/C_{DAC}$ by calibration. It is only necessary to improve $\sigma_{DAC}/C_{DAC}$ by about 3 bits. In contrast, calibrated-linear pipeline ADCs currently on the market often rely on $\sigma_{DAC}/C_{DAC}$ being improved by as much as 6 bits. The lower demand for calibration accuracy will be reflected in a much improved long-term reliability of the ADC's performance. Although the use of calibration is not considered to be the most preferable option, it may be an attractive technique to use in certain situations, e.g., when the use of oversampling is not an option (see below), or when low-cost calibration is readily available (which may be the case for some companies with excess capacity of in-house calibration facilities).
Second Embodiment.

ADC circuits produced in large volumes or employed in critical applications (medical, space, etc.) should preferably not rely on calibration and the power consumption should be minimal. These objectives can be achieved by using a first-order (instead of a zero-order) mismatch-shaping encoder [74] in the modified input stage [56A]. Several first-order mismatch-shaping encoders have been invented and disclosed in the past 10 years (see, e.g., the following U.S. Pat. No. 5,138,317 to Story, U.S. Pat. No. 5,221,926 to Jackson, U.S. Pat. No. 5,404,142 to Adams, and U.S. Pat. No. 5,684,482 to Galton). However, these encoders either suffer from an idle-tone problem (i.e., from mismatch-induced spurious tones, which are as undesirable as tones caused by harmonic distortion), or they have a poor spectral-shaping efficiency at high frequencies. A particularly simple, highly-efficient, and idle-tone-free family of mismatch-shaping encoders was described by Steensgaard in "Idle-Tone Free Mismatch-Shaping Encoders," U.S. patent application Ser. No. 09/309,313, filed May 11th, 1999. A member [74A] of this family of encoders is shown in FIG. 13; it is to be used as the mismatch-shaping encoder [74] in FIG. 8. A detailed description of this mismatch-shaping encoder [74A] and a general overview of mismatch-shaping techniques can be found in the patent application by Steensgaard referred to above, which is to be considered incorporated herein by reference.

In short, the mismatch-shaping encoder [74A] operates as follows. The thermometer-coded input signal, $x_0 x_1 x_2 x_3$, is converted to a binary-weighted modulo-four representation "tx" (modulo-four, because four is the number of signals to be permuted). The selector signal "ts" is calculated as the delayed running summation/integral of "tx" modulo four, where "ts" is the numeric value of $s_1 s_0$ expressed in the unsigned binary-weighted number system. The selector signal "ts" controls the rotating multiplexer [76] shown in detail in FIG. 9. The core digital circuit [80] implements this algorithm when the multiplexer [82] is in its default position "A."

The two-bit memory circuit [84] stores a randomly-generated value "tp" until the detector circuit [86] detects that "tp" and "tz" are equal, at which time the multiplexers [82] and [83] are activated and the selector signal "ts" is set to a new randomly-generated value, which is also stored in the memory circuit [84]. The operation is illustrated and exemplified by the timing diagram shown in FIG. 14. Let a "complete set" be defined as a sequence of samples wherein the sums of the individual signals $y_0(k)$, $y_1(k)$, $y_2(k)$, and $y_3(k)$ are the same. In reality, the detector circuit [86] detects when a complete set has been reached. The interesting property of complete sets is that when they are D/A converted the accumulated error will be zero. Any sequence of complete sets represents a mismatch-shaping encoder. For the considered encoder [74A], each complete set starts at a randomly-generated rotation offset, whereby all encoding patterns and thus all potential idle tones are avoided. This technique results in an unusually effective mismatch-shaping operation at high frequencies. Another advantage of this particular implementation is that "ts" is delayed with respect to the input signal $x_0 x_1 x_2 x_3$, whereby only the multiplexer circuit's [76] delay will determine the transition time from $x_0 x_1 x_2 x_3$ to $y_0 y_1 y_2 Y_3$, i.e., high speed operation is feasible.

FIG. 15 shows the frequency spectrum of the output signal from a simulation where the mismatch-shaping encoder [74A] was used in the ADC's [50] modified input stage [56A]. The simulation was based on the same conditions as the simulations represented by FIGS. 7 and 11, however, with a smaller input signal. The thermal noise is shown separately. Statistical simulations indicate that the distribution of the mismatch-induced noise's Nyquist-band power is the same as when using the zero-order mismatch-shaping encoder discussed above, i.e., it may be up to 19 dB larger than than the thermal noise's Nyquist-band power. However, thanks to the first-order mismatch-shaping encoder [74A], the mismatch-induced error signal is not only randomized (i.e., it is a noise-like signal), but its power spectral density is reduced at low frequencies. Clearly, thermal noise is the dominating error source in the frequency range from 0 Hz to approximately 1/10 of the Nyquist frequency. FIG. 16 shows the thermal noise's signal-band power and the mismatch-induced noise's signal-band power as functions of the reciprocal oversampling ratio, i.e., the relative signal bandwidth. The simulated performance of 32 independent implementations are shown separately to illustrate that the mismatch-induced noise's power is a stochastic variable that will attain a new value for each implementation. It can be observed that the mismatch-shaping encoder [74A] indeed is very efficient, even at frequencies close to the Nyquist frequency. It can also be observed that 10 times oversampling is sufficient to suppress the mismatch-induced noise to below the thermal noise level.

Recall that 10 times oversampling generally can be used without significantly increasing the power consumption because all signal capacitors correspondingly can be made 10 times smaller without increasing the signal-band noise power. The modified input stage [56A] used in combination with the proposed first-order mismatch-shaping encoder [74A] is thus a very attractive, simple, and low-cost way to overcome mismatch-induced distortion and noise errors. Other mismatch-shaping encoders can, of course, be used instead of the proposed encoder [74A], but none are known to be more effective.

It is a very interesting aspect that this type of ADC circuits need not be oversampled when used for certain important applications. This aspect will probably require an explanation. Consider, e.g., xDSL modems. The communication media is a simple telephone copper wire causing significant losses at high frequencies. The line's losses are equalized at the receiving end by amplifying the high-frequency portion of the received signal. The signal-to-noise ratio (SNR) of each of the modem's (say) 256 channels of each 4 kHz bandwidth is estimated prior to the actual transmission, and the density of the information transmitted in each channel is adjusted according to the specific channel's signal-to-noise ratio (cf. Shannon's limit). Even when using an ideal ADC to digitize the received signal, the low-frequency channels will generally have a relatively better SNR due to the communication media's relatively better characteristics at low frequencies, whereas the high-frequency channels will have a relatively poorer SNR due to the equalization process whereby ambient noise, cross-talk, and other errors are amplified. Clearly, the design objective is that the ADC's noise figure should be relatively small, say 1 dB or less, for each channel. Due to the communication media's special properties, this objective translates into a specification for the noise's allowable power spectral density, which is more restrictive at low frequencies than it is at high frequencies. Now, consider again FIG. 15, and imagine that the system is not oversampled significantly. Clearly, the noise's (thermal and mismatch-induced) power spectral density has exactly the properties which are appropriate for xDSL modem applications. For systems with a signal bandwidth of only a few MHz or less (such as ADSL modems), the ADC can easily be oversampled 10 times or more without compromising the power consumption, and the ADC can (and possibly should) be designed such that thermal noise is the dominating error in the entire signal band. However, for applications with a significantly wider signal bandwidth, such as VDSL modems, the use of oversampling may be more questionable from a power-consumption perspective, in which case it may be preferable to allow the first-order-shaped mismatch-induced noise to be the dominating error source at high signal-band frequencies. When using this technique, the power consumption can sometimes be reduced significantly without degrading the system's performance.

Further Improvements.

The two embodiments discussed above illustrate simple techniques whereby the dominating error, i.e., errors caused to mismatch of the DAC capacitors [66], can be made non-dominating with respect to thermal noise, which represents the threshold of when all further efforts to reduce noise-like errors are essentially useless. However, eliminating the dominating error usually only implies that another error source will become dominating, although at a higher level of performance. The below discussion describes further improved embodiments incorporating techniques developed to also suppress secondary errors to below the thermal noise level. Clearly, the modified input stage [56A] employing an efficient mismatch-shaping encoder [74] is assumed to be incorporated in all the embodiments discussed hereinafter.

Again referring to the ADC circuit [50] shown in FIG. 4, the second-largest nonlinear error will generally be caused by mismatch of the residue stage's [54] gain factor $A_{OA}$. As discussed above in the prior-art Section, mismatch of $A_{OA}$ will cause an error signal $d_e(k)$ proportional to the residue $r_0(k)$ of $d_0(k)$. If the flash quantizer [52] is deterministic, i.e., if $r_0(k)$ can be described by a residue characteristic equivalent to those shown in FIGS. 2 and 3, then $r_0(k)$ and thus $d_e(k)$ will comprise harmonic distortion of the input signal g(t). Of course, $d_e(k)$ can be suppressed by calibrating $A_{OA}=A_{OD}$ (which is not too difficult to do, because it concerns only one single parameter), but that option should preferably be avoided, if possible, in order to keep the cost and complexity at a minimum. Alternatively, $r_0(k)$ can be made small by increasing the resolution of $d_0(k)$, but if the performance requirements are very high, that approach is not very attractive neither (the resolution required will be impractically high).

Third Embodiment.

As discussed above concerning the first embodiment, errors representing themselves as spurious tones are generally significantly more deleterious than noise-like errors. It is, therefore, an objective to convert $r_0(k)$ into a noise-like signal, whereby mismatch of the gain factor $A_{OA}$ will become much less of a problem. This objective can be achieved by dithering the flash quantizer [52] as shown in FIG. 17. The dithered flash quantizer [88] conceptually is implemented by adding a random signal $p_0(k)$ to g(k), the sum of which is quantized by the flash quantizer [52]. The dithered quantizer [88] will nominally be absolutely linear, however noisy, if the random signal's $p_0(k)$ probability is uniformly distributed in a range which is as wide as the difference between two of the flash quantizer's [52] neighboring threshold voltages. FIG. 18 shows how the dithered flash quantizer [88] can be implemented. Instead of directly adding $p_0(k)$ to g(k), the negative of $p_0(k)$ is added to the latches' [60] threshold voltages provided by the resistor ladder [62B], i.e., effectively $-p_0(k)$ is subtracted from g(k). The proper spacing of the quantizer's [88] threshold voltages is assured by the current source [90] providing a constant current $I_{ref}$ to the resistor ladder [62B]. The random signal $p_0(k)$ is generated by a switched resistive network [92] through which the same constant current $I_{ref}$ also flows. Thereby, a node [94] with the small-signal potential $-p_0(k)$ is generated. The node's [94] dc potential is set by a resistor [96] connecting the switched network [92] to the reference voltage $-V_{ref}$. Ideally, the switched network's [92] impedance will be a stochastic variable updated in each sample and having a uniform probability distribution in the continuous range from 0 to 6R, where 6R is the resistor ladder's [62B] impedance between two neighboring latches [60]. In practice, the switched resistive network's [92] impedance is more easily implemented as a stochastic variable with a discrete probability distribution. The shown network's [92] impedance can attain only 6 values (0, R, 2R, . . . , 5R), but it is obviously very simple to increase the number of values using a binary-weighted set of resistors rather than the shown set of 5 identical resistors [98]. In any case, the step size in which $p_0(k)$ can be adjusted need not be smaller than the latches' [60] noise level.

The low resolution of $p_0(k)$ was chosen to assure the clarity of FIG. 19 showing the dithered flash quantizer's [88] residue characteristic. The Figure actually shows 6 overlapping residue characteristics, which corresponds to each one distinct value of $p_0(k)$. The average of these 6 characteristics is not shown, but it is very close to zero in the range from $-0.75 \cdot V_{ref}$ to $0.75 \cdot V_{ref}$. In this range the quantizer [88] is almost linear, and the linearity can be improved quite easily by increasing the resolution of $p_0(k)$. The linear range can be expanded by including a few extra latches in the array of latches [60]. Notice that the residue characteristic $4 \cdot r_0(k)$ exceeds the $\pm V_{ref}$ range for some values of $p_0(k)$. It is, therefore, necessary either to choose the gain factor $A_{OA}$ smaller than 4, or to increase the resolution of $d_0(k)$ to, say, 9 levels, which is preferable.

The transfer function from $p_0(k)$ to $r_0(k)$ is minus unity, and mismatch of the gain factor $A_{OA}$ will thus result in a noise-like error signal $d_e(k)$ with essentially uniform power spectral density. In the following, $d_e(k)$ will be referred to as "gain-error-induced noise."

To optimize the power consumption, it should be required that the gain-error-induced noise's power be less than the thermal noise's power. Analysis shows that for an uncalibrated ADC circuit [50A] with a 99% yield, the resolution of $d_0(k)$ must be in the order of 50–100 levels to achieve the required low noise level. In other words, to be optimized, this type of ADC circuit [50A] requires either that $A_{OA}$ is calibrated (only about 3 bits of extra accuracy is required when the first-stage quantizer's [88] resolution is 3–4 bits), or that a high-resolution first-stage quantizer [88] is implemented. Although both options are feasible, and possibly even attractive for some applications, simpler lower-cost techniques will be preferable for consumer-market products.

Fourth Embodiment.

Revisiting FIG. 15, it should be understood that the ADC circuit's noise floor is not limited exclusively by thermal noise; at frequencies higher than approximately one tenth of the Nyquist frequency, the noise floor is generally dominated by mismatch-induced noise. It is, therefore, not necessary to reduce the gain-error-induced noise's power spectral density to the thermal-noise level in the entire frequency range, only so at low frequencies. When using a 3–4 bit quantizer [88], the gain-error-induced noise's worst-case power is approximately the same as that of the mismatch-induced noise. The objective is, therefore, to design an ADC circuit for which $r_0(k)$ is a noise-like signal with a power spectral density shaped in the same way as that of the mismatch-induced noise, see FIG. 15.

The above objective can be achieved by dithering the flash quantizer [52] with a noise-like signal $y_0(k)$ generated by selectively amplifying the residue signal $r_0(k)$ at low frequencies, see FIG. 20. A linear discrete-time filter [100] receives as its input the amplified residue signal $A_{OA} \cdot r_0(k)$ and provides a noise-like signal $y_0(k)$ which is added to the input signal g(k), the sum of which is quantized by the flash quantizer [52]. Notice that the filter [100], the flash quantizer [52], and the residue stage [54A] form a negative-feedback loop. The filter's [100] transfer function can, e.g., be $$\frac{H(z)}{A_{OA}} = \frac{1}{A_{OA}} \frac{z^{-1}}{(1-z^{-1})},$$

which will result in a stable first-order system.

The ADC circuit [50B] shown in FIG. 20 is identical to the ADC circuit [50B] shown in FIG. 21; the Figures are only drawn differently. When drawn as in FIG. 21, the ADC circuit [50B] is easily recognizable as a delta-sigma modulator [102] comprising a compensation path [104] for the generation of the compensating signal $d_{r0}(k)$. Those who are ordinarily skilled in the art of designing delta-sigma modulators will, therefore, be able to choose the filter's [100] transfer function $H(z)/A_{OA}$, such that the modulator [102] will be stable and $r_0(k)$ have a reduced power spectral density in the signal band, i.e., at low frequencies. An important aspect to consider is that the filter [100] is not in a direct signal path (it only generates the dithering signal $y_0(k)$), and that it thus may be implemented using very simple circuitry with a low power consumption. Hence, the inclusion of the filter [100] in the ADC circuit [50B] need not represent a significant increase of the overall cost or complexity. Low-order delta-sigma modulators [102], i.e., modulators for which the loop filter [100] is of a low order, are known to produce deleterious idle tones. It may, therefore, be necessary to add a random dither signal $p_0(k)$ to $y_0(k)$ to efficiently eliminate all potential idle tones. Notice that adding $p_0(k)$ will not change the residue signal's $r_0(k)$ spectral composition significantly, i.e., besides eliminating potential idle tones.

FIG. 22 shows a first-order implementation [102A] of the delta-sigma modulator portion [102] of the ADC circuit [50B]. The input stage [56B] is identical to the input stage [56A] shown in FIG. 8, except for the difference that the flash quantizer's [52] threshold voltages are generated in the same way as shown in FIG. 18, i.e., using a constant-current source [90] and a resistor ladder [62B] connected to a node [94A] having a potential representing the negative of the dithering signal: $-(p_0(k)+y_0(k))$. If the loop filter's [100] gain is large at 0 Hz, which generally will be the case, the dithering node's [94A] dc potential will be self-adjusting. The loop filter [100] is implemented as a simple inverting first-order switched-capacitor integrating circuit [100A]. The switched resistive network [92A] is included to avoid idle tones. The statistical properties of $p_0(k)$ ideally should be the same as for the dithered quantizer [88] shown in FIG. 18, but in practice, even a relatively crude implementation of the switched resistive network [92A] will do a good job. The random signals driving the switched resistive network [92A] can, e.g., be the same signals as those generated for use in the mismatch-shaping encoder [74A], see FIG. 13.

When the loop filter [100] is a first-order integrator [100A], the gain-error-induced noise's power spectral density will attain the same shape as shown in FIG. 15 for the mismatch-induced noise. If the flash quantizer's [52] resolution is 3–4 bits, which generally is acceptable from a complexity perspective, the gain-error-induced noise's power will typically have approximately the same upper limit as the mismatch-induced noise's power, and the ADC circuit [50B] may be considered to be optimized. However, in some situations, e.g., if the flash quantizer's [52] resolution is very low (say, if $d_0(k)$ is a two-level signal), or if the gain factor $A_{OA}$ is only poorly controlled, it may be an objective to suppress the gain-error-induced noise more efficiently in the signal band. This objective can be achieved quite easily by increasing the loop filter's [100] order. FIG. 23 shows a third-order switched-capacitor filter [100B], which can be interchanged with the first-order filter [100A] in FIG. 22. If the third-order filter [100B] is used, it may not be necessary to add random dither $p_0(k)$ to suppress idle tones, which are less likely to be generated by higher-order modulators [102]. However, it is generally a good idea to add random dither anyway, which is very simple to do. The third-order filter's [100B] conceptual topology is shown in FIG. 24. Notice that the input stage [56B] in FIG. 22 can be modeled in FIG. 24 by $r_0(k) = -y_0(k-1)$, i.e., by a delaying and amplifying signal path from the filter's [100B] output to its input. Those who are ordinarily skilled in the art of designing switched-capacitor delta-sigma modulators will be able to modify and design the loop filter [100] to meet the specifications on hand. Considering that the filter's [100] linearity and noise performance need not be very good, the complexity and power consumption of even higher-order filters [100] need not be significant.

Further Improvements.

Now referring to FIG. 22, consider the situation where the input stage's [56B] opamp [72] is nonlinear. This nonlinear effect will cause an error signal which is harmonic distortion of $A_{OA} \cdot r_0(k)$. If $A_{OA} \cdot r_0(k)$ is a noise-like broadband signal, which it will be when the flash quantizer [52] is dithered as described above, the error signal produced by opamp [72] nonlinearities will be noise-like and have an essentially uniform power spectral density. Thus, assuming that the opamp [72] has a reasonably high gain and is not too terribly nonlinear, this error signal will be dominated by thermal noise, and can thus be neglected. Notice that this error's spread power spectral density is yet another advantage obtained by dithering the flash quantizer [52]. In September 1998 at IEEE's 5th International Conference on Electronics, Circuits and Systems in Lisbon, Portugal, Steensgaard presented a paper titled, "Nonlinearities in SC Delta-Sigma A/D Converters," wherein it was shown that the opamp-nonlinearity-induced error signal can be suppressed at low frequencies when using correlated-double-sampling techniques. However, it is generally not necessary to do so, except in rare situations where a relatively good opamp [72] cannot be designed.

Now referring to FIG. 21, only errors from the residue quantizer [58] remain to be dealt with. If the flash quantizer [52] is dithered effectively, $A_{OA} \cdot r_0(k)$ will be a noise-like broadband signal. Nonlinear behavior of the residue quantizer [58] will thus result in a noise-like error signal with uniform power spectral density, and not in spurious tones, which is a significant advantage. For most applications, sufficiently good performance can be achieved when the residue quantizer [58] is implemented as a traditional uncalibrated pipeline ADC. For more critical applications, the residue quantizer [58] can be designed as a pipeline quantizer, wherein the input stage incorporates a mismatch-shaping encoder (as shown in FIG. 8), and wherein the flash quantizer [52] possibly also is dithered as discussed above (shown in FIG. 22). In other words, all techniques disclosed in this patent application can be used recursively. However, instead of striving to linearize the residue quantizer [58], it is often better to make the system's [50B] performance more robust to the quantizer's [58] nonlinearities by suppressing the induced errors in the signal band. A simple and very attractive way to achieve this objective is discussed below.

Fifth Embodiment.

FIG. 25 shows a further modified version [50C] of the ADC circuit [50B]. Here, the residue signal $r_0(k)$ is not digitized directly as it is in traditional pipeline ADC circuits [50] and improved variations [50A][50B] thereof. Instead, the output signal $m_0(k)$ from a first filter stage [108] in the loop filter [100] is digitized by the residue quantizer [58]. To generate the estimate $d_{r0}(k)$ of $r_0(k)$, the digitized signal $d_{m0}(k)$ is processed by a digital filter [110], the transfer function of which, $1/H_{1D}(Z)$, nominally is the reciprocal of the first filter stage's [108] transfer function $H_1(z)$. Of course, it is perfectly acceptable that the combined transfer function $H_1(Z)/H_{1D}(z)$ nominally represents one or more samples of delay, a property which may be used to simplify the circuit's [50C] implementation and increase the sampling frequency at which it can be clocked. Notice that the first filter stage [108] is in the direct signal path for $d_{r0}(k)$, and that it thus should be implemented carefully. The loop filter's second filter stage [112] can be implemented using very simple circuitry with a relatively lower power consumption. An advantage of this ADC circuit [50C] is that the first filter stage [108] will provide high gain in the signal band, whereby signal-band errors induced by imperfections in the residue quantizer [58] will be suppressed efficiently by the digital filter [110]. Considering that the residue quantizer [58] generally can be made reasonably linear by design, it is found that the use of first-order filters [108][110] typically will be sufficient to suppress the induced errors to below the overall noise floor. More efficient suppression of signal-band errors caused by the residue quantizer [58] can be obtained by using a higher-order filter [108].

Some degree of mismatch of the filters [108][110] is to be expected. However, mismatch of the filters is not a major concern because the system's [50C] robustness thereto can be improved quite easily by increasing the second filter stage's [112] order. The improved robustness is achieved because the signal-band power spectral density of the noise-like signal $m_0(k)$ will be reduced when the second filter stage's [112] order is increased. The use of a low-order filters [108][110], especially the use of first-order filters, is recommendable because their frequency response is relatively better controlled, and because the second filter stage [112] thereby will be of relatively higher order (assuming that the loop filter's [100] order is fixed). In conclusion, the proposed ADC circuit [50C] is extremely robust; performance in the excess of 100 dB is achievable from an uncalibrated circuit.

Implementation.

FIG. 26 shows a block diagram [102A] of how the delta-sigma modulator portion [102] of the ADC circuit [50C] can be implemented. The loop filter [100] is of third order [100A], and the first filter stage [108] is a simple scaled integrator [108A]. The loop filter's [100A] frequency response is nominally determined by the three scalar coefficients: $A_0$, $w_1$, and $w_2$. The node-voltages are not scaled in this simplified representation, but to do so is a trivial task for those who are skilled in the art of designing switched-capacitor circuits.

FIG. 27 shows a circuit-level implementation of the ADC circuit [50C] based on the loop filter [100A] shown in FIG. 26. The first filter stage [108A] is build around the input-stage opamp [72]. In fact, the main (only) difference between this input stage [56C] and the input stage [56B] shown in FIG. 22 is that the feedback capacitor [118] is not reset in clock phases $\Phi_1$, whereby the switched-capacitor circuit [108A] becomes an integrating one. Thus, the transition from the type of ADC circuit [50B] shown in FIG. 21 to the type of ADC circuit [50C] shown in FIG. 25 represents a simplification. The second filter stage [112] is implemented as a switched-capacitor biquad circuit [112A]. The capacitor [120] which may be used to move the biquad's [112A] maximum-gain frequency from dc to a non-zero value is not represented by a signal path in FIG. 26. Those who are skilled in the art of designing delta-sigma modulators know that certain advantages can be obtained by including this capacitor [120], but for simplicity, it will be neglected in the following discussion. Notice that the digital filter [110A] indeed is very simple to implement when the first filter stage is a first-order integrator [108A]. The residue quantizer [58] is assumed to be implemented as a traditional uncalibrated pipeline ADC. If the ADC circuit's [50C] oversampling ratio is 10, the residue quantizer [58] need be only about 10-bit linear for it not to limit the signal-to-noise ratio at less than about 100 dB (assuming that $d_0(k)$ is of 3-bit resolution).

Further Improvements.

The fifth embodiment, i.e., the ADC circuit [50C] shown in FIG. 27, is indeed very robust and suitable for the implementation of uncalibrated high-performance ADCs for use in consumer-market products. Because the performance relatively easily can be made limited by thermal noise, it will not be possible to improve the achievable performance without also increasing the power consumption. In other words, the ADC circuit [50C] is fully optimized.

The sixth embodiment, which is discussed below, does thus not concern the further suppression of errors; it is an attempt to maximize the sampling frequency, thereby optimizing the signal bandwidth and noise performance for a given allowed power consumption.

The above ADC circuit [50C] can be clocked at essentially the same high clock rate as traditional pipeline ADCs. However, this type of circuits (i.e., including traditional pipeline ADCs) have a non-optimal use of the first-stage opamp's [72] gain-bandwidth product due to the flash quantizer's [52] unavoidable latency. In fact, to keep the so-called bit-error-rate low, which is very important, the flash quantizer [52] must be allowed a certain amount of time to respond. Thus, if the duration of each clock phase $\Phi_2$ is the sum of the flash quantizer's [52] response time and the opamp's [72] settling period, the power consumption may be unnecessarily high. If the full duration of each clock phase $\Phi_2$ can be used for the opamp [72] to settle in, a significant reduction of the power consumption can be achieved for circuits clocked at high sampling frequencies.
Sixth Embodiment.

FIGS. 28, 29, 30, and 31 show variations [102B][102C][102D][102E] of the delta-sigma modulator circuit [102A] from FIG. 26. The analog feedback signal $\alpha(k)$ is now deliberately delayed one full clock cycle with respect to when the input signal g(t) is sampled. Thus, the analog feedback signal $\alpha(k)$ will be readily available at the beginning of each clock phase $\Phi_2$, the duration of which can be used entirely for the input-stage opamp [72] to settle in. The following discussion will center around how the circuits' stability and macroscopic behavior can be preserved, such that they can be used for the implementation of ADC circuits [50C] of the type shown in FIG. 25. The scalar parameters, $A_0$, $w_1$, and $w_2$, are identical in all the Figures, i.e., once a good and stable delta-sigma modulator [102A] has been designed, the scalar parameters can be transferred directly to the circuits shown in FIGS. 28–31.

Now referring to FIG. 28, it is simple to verify that the deliberate delay [124] can be compensated for by including an extra local feedback path [126]. In other words, the delta-sigma modulator's [102B] loop response, and the four transfer functions defined from g(k) and $d_0(k)$ to $m_0(k)$ and $y_0(k)$ are the same in FIGS. 26 and 28. The only two signals which are different are the analog feedback signal $\alpha(k)$, which is delayed, and the output signal from the first integrator [108A]. However, these signals are internal and the modification performed is not observable from the output signals $d_0(k)$ and $m_0(k)$. Unfortunately, extra circuitry will be required to implement the adder [128] since $m_0(k)$ must be externally available.

If the delta-sigma modulator [102C] is implemented as shown in FIG. 29, then the adder [128] can be made an integral part of the circuitry implementing the second integrator [130]. In this case, yet another local feedback path [132] is required to compensate for the signal component which should flow through the first local feedback path [126] and continue through the feedforward path [134]. Unfortunately, the transfer function from g(k) to $m_0(k)$ is not maintained in this implementation [102C], which is undesirable.

FIG. 30 shows an improved version [102D] where the external behavior is restored. Here, $m_0(k)$ is calculated as a linear combination of the first integrator's [108A] output signal and the analog feedback signal $\alpha(k)$. FIG. 31 shows an alternative version [102E] with the same external behavior; here $m_0(k)$ is calculated as a linear combination of the delayed input signal g(k−1) and the first integrator's [108A] output signal. Because an analog delay line [136] is needed for the implementation of the latter version [102E], the former version [102D] is considered to be preferable from a complexity point of view. Other variations (not shown) are possible.

FIGS. 32 and 33 show a circuit-level implementation of the ADC circuit [50C] from FIG. 25 based on the modified delta-sigma modulator [102D] shown in FIG. 30. First consider the implementation of the delta-sigma modulator [102D]. The input stage [56D] is equivalent to the input stage [56C] shown in FIG. 27, except for the difference that the analog feedback signal $\alpha(k)$, i.e., the set of voltage signals $\alpha_0(k)$, $\alpha_1(k)$, $\alpha_2(k)$, $\alpha_3(k)$, is delayed one clock cycle with respect to when the flash quantizer [52] is strobed. A timing diagram showing this property is shown in FIG. 34A. The loop filter's second stage [112] is implemented as a second-order switched-capacitor filter [112B]. The output voltages, $S_0(k)$, $S_1(k)$, and $-S_2(k)$, of the three opamps [72][138][140] settle towards their next value at the onset of each new clock phase $\Phi_2$, see FIG. 34A. The first voltage, $S_0(k)$, represents the output of the first integrator [108A]; the second voltage, $S_1(k)$, represents the output of the second integrator [130]; and the third voltage, $S_2(k)$, represents the dithering signal $y_0(k)$. The first local feedback path [126] is implemented by the four capacitors in the capacitor array [142] which are connected to the second filter stage [112B]. The second local feedback path [132] is implemented by the capacitor array [144] which is driven directly (i.e., without any delay) by the flash quantizer [52]. Notice that it is the flash quantizer [52] which provides the one-sample delay in the loop comprising the second local feedback path [132]. Incomplete settling of the third opamp [140] is acceptable because it is not in any critical signal path (errors will only affect $y_0(k)$).

The lower part of FIG. 32 shows how the first stage of the residue quantizer [58] can be implemented. The implementation is not trivial because the opamp's [146] output voltage, $S_4(k)$, represents the residue of $m_0(k)$ with respect to $u_1(k)$, where $u_1(k)$ is the first digit in the digital estimate $d_{m0}(k)$ of $m_0(k)$. The unusual aspect is that $m_0(k)$ is not generated as a voltage signal in the direct signal path; the digital estimate $u_1(k)$ of $m_0(k)$ and the corresponding feedback signal $\beta(k)$ (represented by a set of two-level voltage signals: $\beta_0(k)$, $\beta_1(k)$, $\beta_2(k)$, and $\beta_2(k)$) is generated ahead of time by the incidental circuit [148] shown separately in FIG. 33. In FIG. 33, the subtraction circuit [150] generates an estimate $S_3(k)$ of $-m_0(k)$, which is quantized by the buffered flash quantizer [152] to generate $u_1(k)$ and $\beta(k)$. As shown in the timing diagram in FIG. 34A, $u_1(k)$ and $\beta_0(k)$ are available just when they are needed, i.e., at the same time as when a charge pulse representing $m_0(k)$ is fed to the opamp [146] in FIG. 32. One advantage of this implementation is that only one reasonably good opamp [146] is needed besides the input-stage opamp [72]; the open-loop gain from g(k) to $S_4(k)$ can be made large. The first-order difference of $u_1(k)$ is the most significant digit $d_1(k)$ of $A_{OD} \cdot d_{r0}(k)$ (compare to FIG. 1). The remaining digits of $A_{OD} \cdot d_{r0}(k)$ are obtained by digitizing and calculating (possibly digit-wise) the first-order difference of $S_4(k)$ (not shown). FIGS. 34B and 34C show mathematical expressions for, and the first few numeric values of, the signals shown in the timing diagram in FIG. 34A; they may provide additional insight when analyzing the circuit.

Clearly, the technique of delaying the analog feedback signal with respect to the sampling instance can be used recursively. The scenario of the quantizer [152] being strobed immediately before a charge pulse representing $m_0(k)$ is dumped to the opamp [146] is equivalent to the scenario of the flash quantizer [52] being strobed just before a charge pulse representing g(k) is dumped to the input-stage opamp [72]. When using the technique recursively, the maximum sampling frequency will be limited only by the operational amplifiers' characteristics.
General Topology.

The reader will understand that this invention has numerous embodiments, and that all cannot be described in this patent application. Several other interesting embodiments are described in Steensgaard's PhD thesis, "High-Performance Data Converters," The Technical University of Denmark, Mar. 8, 1999, ISBN 87-89112-52-0, which is to be considered incorporated herein by reference. FIG. 35 shows an attempt to illustrate the general concept.

It is to be understood that the ADC circuit [50D] need not employ a sampling switch at its input; an embodiment for which this is not the case will be described shortly. Thus, the five analog signals named in FIG. 35, g, $r_0$, $y_0$, $\alpha$, and $m_0$, can be either discrete-time or continuous-time signals (or a mixture thereof).

A first digital estimate $d_0(k)$ of the input signal g is generated such that the signal-band power spectral density of the portion of the residue signal $r_0$ which is not linearly related to g, is small. This is achieved by quantizing the sum of g and $y_0$ with a first quantizer [154]. The first quantizer may be a deterministic flash quantizer, but it can also be a more sophisticated type of quantizer system, see, e.g., the international patent application PCT/IB99/01403 filed by Steensgaard Aug. 6, 1999, and Footnote 13 and FIG. 9.9 in Steensgaard's PhD thesis. The signal $y_0$ will generally comprise a signal component generated by amplifying the residue signal $r_0$ with a filter [158]. Ideally, the closed-loop transfer function from g to $y_0$ is zero, or at least small in the signal band; the optional signal paths [166][168] illustrate that it is possible to compensate in $y_0$ for the signal component in $r_0$ which may be linearly related to g. This compensation concept, which is also illustrated by FIG. 30 and the seventh embodiment described below, is particularly useful for continuous-time implementations because the analog feedback signal a generally will be delayed with respect to the input signal g. The signal $y_0$ may also comprise a random signal component (random dither), which in extreme cases may be the only signal component comprised in $y_0$ (see FIG. 17, where $p_0(k)=y_0(k)$).

The analog feedback signal a must be a highly-accurate analog representation of $d_0(k)$, at least in the signal band; otherwise the generated residue signal $r_0$ will be inaccurate and likewise the digital compensation signal $d_{r0}(k)$. Any sufficiently good DAC [156] may be used to generate $\alpha$; the use of mismatch-shaping techniques is but one (simple) way to linearize DACs. The techniques described in the U.S. patent application No. 60/044,665 filed Apr. 18, 1998, by Steensgaard are very useful if the resolution of $d_0(k)$ is high. The analog feedback signal $\alpha$ may be, and often will be, delayed with respect to the input signal g, in which case the transfer function from g to $r_0$ will have a high-pass characteristic.

The objective is to generate an analog compensation signal $m_0$ having a well-known and well-controlled relationship to the residue $r_0$ of g with respect to $d_0(k)$. One option is to let $m_0=A_0 \cdot r_0$, where $A_0$ is a preferably large constant. It is preferable to generate $m_0$ such that, for $\alpha=0$, the gain from g to $m_0$ is as large as possible; if not at all frequencies then at least in the system's [50D] signal band. Because the second quantizer [160] digitizing $m_0$ will have a finite full-scale range, the gain from g to $m_0$ when $\alpha=0$ can be made large only if the gain from g to $m_0$ is relatively much smaller when the loop is closed, i.e., when the first quantizer [154] and DAC [156] generate the analog feedback signal $\alpha$. In other words, the open-loop transfer function from g to $m_0$ should be as large as possible, whereas the closed-loop transfer function from g to $m_0$ should be as small as possible. Ideally, $m_0$ will represent only the quantization process taking place in the first quantizer [154]. When the transfer function from g to $m_0$ is optimized (i.e., zero), the gain factor by which $m_0$ can be amplified will depend only on the resolution of $d_0(k)$. If the analog feedback signal $\alpha$ is delayed with respect to g, or if for some other reason $r_0$ comprises a signal component linearly related to g, the analog compensation signal $m_0$ should be generated as a linear combination of g, $\alpha$, and one or more of the filter's [158] state variables, such as to minimize the closed-loop gain from g to $m_0$. If the worst-case spectral composition of g is known, this information may be used to simplify the circuit [50D]; the transfer function from g to $m_0$ need be made small only at frequencies where g comprises significant spectral components (this observation is particularly useful for continuous-time implementations).

The analog compensation signal $m_0$ is digitized by the second quantizer [160], which may be of essentially any type. If the ADC system [50D] is implemented using switched-capacitor circuit techniques, the second quantizer [160] will typically be best and simplest implemented as a pipeline quantizer. If the ADC system [50D] is implemented using continuous-time circuit techniques, the second quantizer [160] can be implemented, e.g., as a folding-and-interpolating quantizer, as a sub-ranging quantizer, or as a two-step flash quantizer. However, when using continuous-time circuit techniques it is particularly attractive to implement the second quantizer [160] as a continuous-time delta-sigma modulator, possibly as a residue-compensated one shown in FIG. 35 (recursive use).

The output signal $d_g(k)$ is calculated as the sum of $d_0(k)$ filtered by a first digital filter [162] and $d_{m0}(k)$ filtered by a second digital filter [164]. The first digital filter's [162] transfer function, $H_0(z)$, will typically just delay $d_0(k)$ by zero or more samples, but it may be any linear filter. It is of course very important to know how to choose the second filter's [164] transfer function $H_1(z)$. A very simple and accurate method to find the optimal transfer function, $H_1(z)$, is as follows. Make an experiment (i.e., a simulation or a calculation) for which the input g is zero and $d_0(k)$ is a digital-impulse signal, i.e., $d_0(k)$ is one for k=0 and otherwise zero. This will break the feedback loop and a given signal $d_{m0}(k)$ will be generated. If any circuit element is nonlinear or subject a (pseudo) stochastic process (e.g., if the second quantizer [160] is a delta-sigma modulator), it should be replaced by a linear deterministic circuit element with the same signal transfer function while this experiment is performed (spectral aliasing due to sampling should be modeled, i.e., sampling switches should only be idealized). Now knowing $d_0(k)$, $d_{m0}(k)$, and $H_0(z)$, simply choose $H_1(z)$ such that the output signal $d_g(k)$ will be zero. A solution can always be found provided that $H_0(z)$ delays $d_0(k)$ sufficiently. For specialized applications, $H_1(z)$ may even be designed as an adaptive filter (for self-calibrating systems).

Seventh Embodiment.

Continuous-time delta-sigma modulators are characterized by not sampling the input signal g(t) at the input, which is associated with several advantages. One significant advantage is that the performance is less sensitive to aliasing errors, and that the frequency response of the anti-aliasing filter (not shown), which generally will precede the ADC circuit, therefore, can be relaxed. This and other significant advantages can also be obtained from ADC circuits implemented according to this invention when using a continuous-time filter to generate the dithering signal $y_0(t)$.

FIG. 36 shows a subcircuit [200] which will be used in the ADC circuit to be described. The flash quantizer [202] samples and quantizes the sum of the input signal g(t) and the dithering signal $y_0(t)$ to a digital representation $d_0(k)$. For this initial discussion only, it will be assumed that $y_0(t)$ is zero, and that the flash quantizer's [202] resolution is infinite. The objective is to investigate the DAC's [204] properties. The output signal $\alpha(t)$ is a continuous-time signal, whereas by definition, $d_0(k)$ is a discrete-time signal.

The D/A converter [204], therefore, invariably implements a discrete-time to continuous-time (DT/CT) conversion. The DT/CT conversion's characteristics depend on the DAC's [204] so-called impulse response, i.e., the waveform provided in response to a digital impulse signal. Since a consistent impulse response is of the utmost importance, it is preferable that it be delayed with respect to the digital input signal $d_0(k)$. In this way, it is possible to avoid/suppress dynamic errors, which e.g, can be caused by signal-dependent latency of the flash quantizer [202]. FIG. 37A shows a typical so-called zero-order-holding impulse response, which is delayed one half clock cycle with respect to the digital impulse signal. The DAC's [204] "effective delay" is defined as the impulse response's geometrical center in time with respect to the digital impulse, which by definition occurs at t=0. For all symmetrical impulse responses, the effective delay represents accurately the delay of each spectral component in $\alpha(t)$ with respect to the corresponding spectral component in $d_0(k)$ (this is valid at all frequencies). Since the DAC [204] must be causal, it will always be characterized by a positive effective delay. The effective delay of DACs characterized by the delayed zero-order-holding impulse response shown in FIG. 37A, and also that of DACs characterized by the raised-cosine impulse response shown in FIG. 37B, is one clock cycle.

The DAC [204] will typically provide a current as its output, whereas g(t) usually is a voltage signal. Thus, for $K_0$ defined as a voltage gain, the DAC's [204] gain is $K_0/R$, where R is an impedance with respect to which the DAC's [204] gain is defined.

FIG. 38 shows the time-domain input-output relationship of the subcircuit [200], assuming that the DAC's [204] impulse response is as shown in FIG. 37A. Clearly, $\alpha(t)$ is not only delayed with respect to g(t), the waveform is also vastly different. The different waveforms reflect that the signals' spectral compositions are very different at high frequencies. A more similar waveform can be obtained when using a DAC [204] with a more smooth impulse response, e.g., that shown in FIG. 37B. Expressed more precisely in technical terms, the impulse response shown in FIG. 37B suppresses better the high-frequency spectral replicas which inherently are comprised in $d_0(k)$.

FIG. 39 shows a traditional third-order continuous-time delta-sigma modulator [206]. This Figure, and all Figures discussed hereinafter, refer to the realistic situation where $y_0(t)$ is non-zero and the flash quantizer's [202] resolution is finite. The feedback DAC [204A] is characterized by a non-delayed zero-order-holding impulse response; the DAC's [204A] effective delay is thus one half clock cycle. Those who are ordinarily skilled in the art of designing continuous-time delta-sigma modulators will be able to choose the loop filter's [208] frequency response. For simplicity, one may assume that the three continuous-time integrators' [210][212][214] time constants, $\tau_0, \tau_1, \tau_2$, all are equal to the sampling period, $T_{clk}$, in which case the loop filter's [208] frequency response will be determined exclusively by the three scalar parameters: $c_0, c_1$, and $c_2$.

FIG. 40 shows the input stage [216] of a similar continuous-time delta-sigma modulator. The effect of incorporating an input-feedforward signal path [218] and a local feedback signal path [220] will be investigated. For simplicity, it will be assumed that the two signal paths [218][220] have the same gain $k_0$. Compare the characteristics of the circuit [216] for $k_0=0$ and for non-zero values of $k_0$. For $k_0=0$, the output signal will be $$m_0(t) = \int \frac{g(t) - \alpha(t)}{\tau_0} dt.$$

Compared to this situation, the inclusion of the input-feedforward signal path [218] will effectively delay the input signal g(t), and the inclusion of the local feedback path will effectively advance the analog feedback signal $\alpha(t)$, i.e., $$m_0(t) \simeq \int \frac{g(t - \Delta T) - \alpha(t + \Delta T)}{\tau_0} dt, \text{ where } \Delta T = \tau_0 \cdot k_0.$$

where $\Delta T = \tau_0 \cdot k_0$. This interpretation is accurate in a limited frequency range only, but for $\Delta T \leq T_{clk}/2$ it will be sufficiently accurate in the entire Nyquist frequency range. Notice that if $\alpha(t) \cong g(t - T_{clk})$ and $\Delta T = \tau_0 \cdot k_0 = T_{clk}/2$, then $m_0(t)$ will be largely independent of g(t), i.e., the closed-loop signal transfer function from g(t) to $m_0(t)$ will be small, which is desired.

This input stage [216] is now used increase to one full clock cycle the effective delay of the feedback DAC [204A] in the delta-sigma modulator [206] shown in FIG. 39. Hence, $k_0 \cdot \tau_0 = T_{clk}/2$. The same type of transformations that were used to convert FIG. 26 into FIG. 30 can be used to derive the delta-sigma modulator circuit [206A] shown in FIG. 41 from the delta-sigma modulator circuit [206] shown in FIG. 39. The transformations are applied to the input paths [224] as well as the feedback paths [226]. The time constants, $\tau_0, \tau_1$, and $\tau_2$, and the scalar parameters, $c_0, c_1, c_2$, are the same in the two circuits [206][206A]. Minor modifications of the second local feedback path's [237] gain and the scalar parameters, $c_0, c_1$, and $c_2$, may be carried out to optimize the modulator's [206A] loop response, which is fully controllable.

In principle, a separate circuit [228] may be used to calculate the analog compensation signal $m_0(t)$. The second quantizer [160] in FIG. 35 is here implemented as a second-order delta-sigma modulator [230] of the same type as the first delta-sigma modulator [206A]. The feedback DAC's [232] effective delay is one full clock cycle, and thus the input paths [234] and the feedback paths [236] are designed as discussed above to assure the modulator's [230] stability, and to make its signal transfer function approximately frequency-independent.

It can be observed that $m_0(t)$ is delayed one half clock cycle with respect to g(t). Hence, the second flash quantizer [238] should preferably be strobed one half clock cycle after the first flash quantizer [202] is strobed. The first digital filter's [162B] transfer function $H_0(z)$ should then consist of one half clock cycle of delay. The second digital filter's [164B] transfer function $H_1(z)$ can be designed as an approximation of an ideal differentiator (for signal-band frequencies f):

$$H_1(z) \simeq j \cdot 2\pi \cdot f \cdot \tau_0 \cdot \frac{K_0}{K_1}, \text{ where } z = e^{j \cdot 2\pi f \cdot T_{clk}}.$$

The simplest design solution is to set $$H_1(z) = \frac{\tau_0}{T_{clk}} \frac{K_0}{K_1} \cdot (1 - z^{-1}),$$

but a higher-order filter [164B] may be used to improve the compensation for $m_0(t)$ in a wider frequency range. Much better performance can, e.g., be obtained with a 6th order FIR filter:

$$H_1(z) = \frac{\tau_0 \cdot K_0 \cdot \begin{pmatrix} 2.1133 - 4.5823 \cdot z^{-1} + 4.9445 \cdot z^{-2} - 4.2486 \cdot \\ z^{-3} + 2.5820 \cdot z^{-4} - 1.0021 \cdot z^{-5} + 0.1921 \cdot z^{-6} \end{pmatrix}}{T_{clk} \cdot K_1}.$$

However, the "experiment method" described above is considered to be the best way to choose the transfer function $H_1(z)$. For the purpose of that simulation/calculation only, the second flash quantizer [238] and DAC [232] should have infinite resolution (the sampling process and delay should be preserved). The obtained ideal transfer function's $H_1(z)$ impulse response can generally be approximated by a filter [164B] of a reasonably low order, say by a sixth-order FIR filter.

Implementation.

FIG. 42A shows a fully-differential implementation [206B] of the first delta-sigma modulator circuit [206A] in FIG. 41. The loop filter [240] is based on three differential opamps [242][244][246] configured as integrators, and a fourth opamp [248] configured as a differential-to-single-ended converter driving the single-ended flash quantizer [202]. The input signal paths [224] are implemented by simple resistors [250]. The feedback paths [226] are implemented by three DACs [252]. The DAC [254] driving the fourth opamp [248] is simply an array of current sources (not shown specifically) controlled directly (i.e., without any delay or mismatch shaping) by the flash quantizer [202]. The DAC's [254] static accuracy and impulse response is not very critical because errors will not accumulate and will affect only the next value of $d_0(k)$. The two other DACs [256][258], especially the main feedback DAC [258], are more critical and should provide highly-accurate analog equivalents of $d_0(k)$. A mismatch-shaping encoder [74A] is used to suppress in the signal band errors due to static mismatch. Dynamic errors can be suppressed easily because the DACs' [256][258] impulse responses are delayed with respect to the flash quantizer's [202] sampling instances. The input signal, $g(t)$, the first opamp's [242] output signal, $S_0(t)$, and the digital signal, $d_0(k)$, which jointly represent $m_0(t)$, are provided as input signals to the second delta-sigma modulator [230A] shown in FIG. 42B.

FIG. 42B shows an implementation [230A] of the second delta-sigma modulator [230] in FIG. 41. The loop filter [260] is equivalent to the loop filter [240] in FIG. 42A, however of only second order. The feedback paths [262] are also similar to the feedback paths [252] in FIG. 42B. The use of a mismatch-shaping encoder [264] is optional, and generally not needed. The input paths [266] are each implemented as a separate implementation of the summing circuit [228] shown in FIG. 41. The flash quantizer [268] is quite similar to the flash quantizer [202] in FIG. 42A, except that it [268] is strobed one half clock cycle later, i.e., at the end of clock phase $\Phi_2$ rather than at the end of clock phase $\Phi_1$. This delay implies that the DAC [274] partly implementing the direct input path requires special attention. Its impulse response should not be delayed with respect to $d_0(k)$, it should be a zero-order-holding one spanning clock phases $\Phi_2$ and $\Phi_1$ (in that order). The DAC [274] can be operated in parallel with the equivalent DAC [254] in FIG. 42A. The DAC's [274] gain may have to be adjusted and optimized by means of simulations. Both flash quantizers [202][268] should preferably be of relatively high resolution, say 4–5 bits. The first digital filter [162B] merely aligns the digital signals provided by the two flash quantizers [202] and [268]. The design of the second digital filter [164B] was discussed above. It is especially the two DACs [270][272] which preferably should have a smooth impulse response, e.g., similar to that shown in FIG. 37B. The ADC system is relatively robust to dynamic errors caused by these DACs [270][272].

6 CONCLUSION, RAMIFICATION, AND SCOPE OF INVENTION

Accordingly, the reader will see that A/D converter circuits implemented according to this invention have several significant advantages facilitating the implementation of low-cost general-purpose high-performance wide-bandwidth A/D converters. Particularly, it is an advantage that the circuits' robustness with respect to unavoidable tolerances in the manufacturing process is very good.

ADC circuits implemented according to this invention are, e.g., very useful for the implementation of digital-communication system, such as xDSL modems, for which the currently available ADC solutions are very costly. One major advantage of this invention, which is particularly important for xDSL modems, is that circuit imperfections will cause noise-like error signals rather than spurious tones. Furthermore, the noise floor can be customarily shaped to meet the application's demands. For applications with a signal bandwidth of (say) a few MHz, which includes video applications and most xDSL modems, the ADC can quite easily be oversampled 5–10 times and noise-like signal-band errors be suppressed to below the thermal noise floor. These ADC circuits can also be used in Nyquist-band systems which require the maximum level of performance in only a fraction of the Nyquist frequency range, which is the case for most xDSL modems. This aspect is especially important for the implementation of wide-bandwidth VDSL modems, for which the use of anything but a minimum degree of oversampling may not be considered tolerable.

Although the many advantages of these ADC circuits have been emphasized with reference to the implementation of xDSL modems, it is to be understood that they are indeed very useful for a much broader range of applications because they combine high performance and simplicity in a very advantageous way. The linearity is, e.g., as good a that of traditional delta-sigma modulators, but the achievable signal bandwidth is much wider and the output signal's resolution much higher. In comparison to delta-sigma modulators, another significant advantage is that the relatively complex digital decimation filter can be greatly simplified, if not entirely omitted. Considering that the decimation filter often is the bottleneck of delta-sigma modulators in terms of circuit complexity and power consumption, it may be concluded that the simplicity of several embodiments of this invention makes it very useful and advantageous also for use in low-bandwidth applications.

The invention is most easily implemented when using discrete-time circuit techniques, in which case the circuitry's complexity largely will be comparable to that of uncalibrated pipeline ADC circuits. However, when using discrete-time circuit techniques, the input signal $g(t)$ will invariably have to be sampled at the input and the overall performance be subject to aliasing thermal noise (sometimes called kT/C noise). Furthermore, the overall linearity may be limited by the sampling switch's finite linearity. Continuous-time delta-sigma modulators are unique in that they are not subject to these significant disadvantages. It is, therefore, considered to be a very important aspect that this invention also can be based on the continuous-time delta-sigma modulator topology. The described (seventh) embodiment based on the use of continuous-time filters also served as an illustration of the overall objectives when designing ADC circuits according to this invention. For example, the compensation technique used to avoid correlation of the input signal and the compensation signal $m_0$ can be used in any embodiment. Likewise, although the seventh embodiment concerned an only two-step ADC circuit, it should be understood that the concept easily can be generalized for the implementation of multi-step residue-compensating ADC circuits. More generally, it is to be understood that while the above description contains many specificities, these should not be construed as limitations of the scope of the invention, but rather as an exemplification of several preferred embodiments thereof. Many other variations are indeed possible. The loop filter can, e.g., be of any order and be implemented in many alternative topologies. Similarly, the loop filter may combine continuous-time and discrete-time circuit techniques to obtain a good noise performance combined with good control of the closed-loop frequency response. The internal quantizers can have any resolution, be delaying or non-delaying, be uniform or nonuniform, and be of almost any type (i.e., they need not be flash quantizers). It it to be understood that the invention can be used also for the implementation of band-pass ADC circuits, although baseband applications have been emphasized in the above description. Clearly, the ADC circuits can be implemented either as single-ended, partly-differential, or fully-differential circuits using essentially any circuit technology (MOS, CMOS, Bipolar, BiCMOS, GaAs, etc.), and employing various circuit techniques (switched-capacitor, switched-current, gm-C, opamp-RC, passive R(L)C, CCD, etc., including any combination thereof). Those who are skilled in the art will be able to make many other variations and modifications without departing from the good nature and spirit of this invention.

Although FIG. 35 served to put this invention in a broader perspective, this Figure, the accompanying description, any other figure, or any other part of the description of this invention, including the validity of any part of the theoretical support provided to improve the understanding of this invention, should not be construed as limiting the scope of invention. Accordingly, the scope of invention should be determined exclusively by the appended claims and their legal equivalents.

I claim:

1. A method for converting an analog input signal to a digital output signal comprising the steps of:
    (a) generating a first digital signal comprising a signal component representing a combination of said analog input signal and a dithering signal;
    (b) generating an analog feedback signal by digital-to-analog converting said first digital signal;
    (c) generating an analog residue signal by combining said analog input signal and said analog feedback signal;
    (d) generating an analog compensation signal using a method comprising the step of processing said residue signal with a first analog filter of at least zeroth order;
    (e) generating said dithering signal using a method comprising the step of processing said analog residue signal with a second analog filter; the order said second analog filter is at least one higher than the order of said first analog filter;
    (f) generating a second digital signal comprising a signal component representing said analog compensation signal; and
    (g) generating said digital output signal by combining said first digital signal and said second digital signal.

2. The analog-to-digital conversion method of claim 1 wherein the step of generating said analog feedback signal comprises the steps of:
    (a) generating a thermometer-coded representation of said first digital signal;
    (b) generating a digital selector signal;
    (c) generating a second representation of said first digital signal by permuting said thermometer-coded representation according to said digital selector signal;
    (d) generating said analog feedback signal by separately digital-to-analog converting each bit in said second representation of said first digital signal.

3. The analog-to-digital conversion method of claim 2 wherein the step of generating said digital selector signal comprises the step of:
    (a) calculating for a segment of said digital selector signal the running sum of the first digital signal modulo the number of bits in the thermometer-coded representation thereof.

4. The analog-to-digital conversion method of claim 2 wherein the selector signal is a random or at least pseudo-random signal.

5. The analog-to-digital conversion method of claim 1 wherein the step of generating said analog feedback signal comprises the step of:
    (a) providing a mismatch-shaping digital-to-analog converter.

6. The analog-to-digital conversion method of claim 1 wherein the step of generating said dithering signal comprises the step of:
    (a) generating a random or at least pseudo-random signal.

7. The analog-to-digital conversion method of claim 1 wherein the step of generating said dithering signal comprises the step of:
    (a) providing a switched-capacitor filter.

8. The analog-to-digital conversion method of claim 1 wherein said first analog filter provides amplification which is essentially independent of frequency.

9. The analog-to-digital conversion method of claim 1 wherein the step of generating said second digital signal comprises the step of providing a pipeline analog-to-digital converter.

10. The analog-to-digital conversion method of claim 1 wherein the step of generating said second digital signal comprises the step of providing an analog-to-digital converter comprising a negative-feedback loop.

11. The analog-to-digital conversion method of claim 1 wherein said analog residue signal is a continuous-time signal.

12. The analog-to-digital conversion method of claim 1 wherein said first analog filter is embodied in said second analog filter.

13. The analog-to-digital conversion method of claim 1 wherein said first analog filter is a first-order integrating circuit.

14. The analog-to-digital conversion method of claim 1 wherein the step of generating said analog residue signal comprises the step of:
    (a) combining at least two charge-transfer signals.

15. The analog-to-digital conversion method of claim 1 wherein the step of generating said digital output signal comprises the steps of:
    (a) generating a digital residue signal by processing said second digital signal with a digital filter;
    (b) adjusting said digital filter's transfer function such that said digital residue signal is a digital representation of a difference between said analog input signal and said first digital signal.

16. The analog-to-digital conversion method of claim 1 wherein the order of said first analog filter is at most two.

17. The analog-to-digital conversion method of claim 1 wherein said second analog filter emphasizes in a selected frequency band the spectral components of said analog residue signal; said selected frequency band being characterized by a particularly good equivalence of said analog input signal and said digital output signal.

18. The analog-to-digital conversion method of claim 1 wherein said analog compensation signal is essentially uncorrelated to said analog input signal.

19. The analog-to-digital conversion method of claim 1 wherein the step of generating said analog compensation signal comprises the step of:
  (a) combining the analog feedback signal and the signal provided by the first analog filter.

20. The analog-to-digital conversion method of claim 1 wherein the step of generating said analog compensation signal comprises the step of:
  (a) combining the analog input signal and the signal provided by the first analog filter.

21. The analog-to-digital conversion method of claim 1 wherein the step of generating said digital output signal comprises the step of:
  (a) filtering said second digital signal with a finite-impulse-response filter having at least two non-zero coefficients.

22. The analog-to-digital conversion method of claim 1 wherein the transfer function defined from said analog input signal to said analog residue signal has a high-pass characteristic.

23. An analog-to-digital converter circuit receiving an analog input signal and providing a digital output signal comprising:
  (a) a first quantizer circuit generating a first digital signal representing a combination of said analog input signal and a dithering signal;
  (b) a digital-to-analog converter receiving said first digital signal and generating an analog feedback signal;
  (c) a first analog filter circuit of at least zeroth order having at least one first-named input terminal and providing an analog compensation signal; said first-named input terminal receiving a signal representing a combination of said analog input signal and said analog feedback signal;
  (d) a second analog filter circuit of at least first order having at least one second-named input terminal and generating said dithering signal; said second-named input terminal being connected to said first analog filter circuit;
  (e) a second quantizer circuit receiving said analog compensation signal and generating a digital compensation signal;
  (f) an output-stage digital circuit combining the first digital signal and the digital compensation signal to generate said digital output signal.

24. The analog-to-digital converter circuit of claim 23 wherein said first quantizer circuit comprises:
  (a) a flash quantizer having a first third-named input terminal of a first polarity and a second fourth-named input terminal of the opposite polarity; said third-named input terminal receiving said analog input signal; said fourth-named input terminal receiving the negative of said dithering signal.

25. The analog-to-digital converter circuit of claim 24 wherein said flash quantizer further comprises:
  (a) a resistor ladder conducting an essentially constant current; said resistor ladder being connected to said fourth-named input terminal and is providing a set of voltage signals which are in a predetermined relationship to said fourth-named input terminal's potential.

26. The analog-to-digital converter circuit of claim 25 wherein said resistor ladder comprises an variable impedance element, the impedance of which is controlled by a random signal; said random signal is of an at least pseudo-random nature.

27. The analog-to-digital converter circuit of claim 23 wherein said digital-to-analog converter is based on a mismatch-shaping algorithm of at least zeroth order.

28. The analog-to-digital converter circuit of claim 23 wherein said digital-to-analog converter is based on a idle-tone-free mismatch-shaping algorithm of at least first order.

29. The analog-to-digital converter circuit of claim 23 further comprising:
  (a) a circuit generating a first random signal of an at least pseudo-random nature; said random signal being partially correlated with said dithering signal.

30. The analog-to-digital converter circuit of claim 23 wherein the transfer function defined from said first-named input terminal to said analog compensation signal, when said analog feedback signal is zero, is of at most second order.

31. The analog-to-digital converter circuit of claim 23 wherein said second quantizer circuit is a pipeline analog-to-digital converter.

32. The analog-to-digital converter circuit of claim 23 wherein said second quantizer circuit comprises a noise-shaping loop.

33. The analog-to-digital converter circuit of claim 23 wherein said first analog filter circuit processes a continuous-time signal.

34. The analog-to-digital converter circuit of claim 23 wherein the transfer function from said analog input signal to said analog compensation signal has a high-pass characteristic.

35. The analog-to-digital converter circuit of claim 23 further comprising:
  (a) an analog front-end circuit providing said analog input signal; said analog analog front-end circuit having a high-pass characteristic.

36. The analog-to-digital converter circuit of claim 23 employed in a digital communication system.

37. The analog-to-digital converter circuit of claim 23 comprising:
  (a) at least one digital-to-analog converter having a smooth impulse response.

38. The analog-to-digital converter circuit of claim 23 wherein said digital-to-analog converter has a deliberately-delayed impulse response.

39. The analog-to-digital converter circuit of claim 23 wherein said digital-to-analog converter's effective delay is at least eighty percent of the clock period.

40. The analog-to-digital converter circuit of claim 23 wherein said digital-to-analog converter is calibrated.

41. The analog-to-digital converter circuit of claim 23 wherein said first analog filter circuit is calibrated.

42. The analog-to-digital converter circuit of claim 23 wherein said dithering signal largely is virtually uncorrelated to said analog input signal.

43. The analog-to-digital converter circuit of claim 23 wherein said first analog filter circuit further comprises:

(a) a third-named input terminal receiving a signal which is essentially equivalent to the analog feedback signal.

44. The analog-to-digital converter circuit of claim 23 wherein said first analog filter circuit further comprises:

(a) a third-named input terminal receiving a signal which is essentially equivalent to the analog input signal.

45. The analog-to-digital converter circuit of claim 23 wherein said second analog filter circuit comprises switches.

46. The analog-to-digital converter circuit of claim 23 wherein said output-stage digital circuit delays said first digital signal.

47. The analog-to-digital converter circuit of claim 23 wherein said output-stage digital circuit filters said digital compensation signal with a finite-impulse-response filter.

48. The analog-to-digital converter circuit of claim 23 wherein said output-stage digital circuit is adaptive.

* * * * *